US010915687B2

(12) United States Patent
Maisel et al.

(10) Patent No.: US 10,915,687 B2
(45) Date of Patent: Feb. 9, 2021

(54) BREADBOARD AND ELECTRONICS EXPERIMENTATION SYSTEM

(71) Applicant: JOEBOTICS INCORPORATED, Cerritos, CA (US)

(72) Inventors: Joseph Julius Maisel, Oakland, CA (US); Leslie Orton, Algorfa, CA (US); Christoper Draden Henderson, Lakewood, CA (US)

(73) Assignee: JOEBOTICS INCORPORATED, Cerritos, CA (US)

( * ) Notice: Subject to any disclaimer, the term of this patent is extended or adjusted under 35 U.S.C. 154(b) by 0 days.

(21) Appl. No.: 16/714,404

(22) Filed: Dec. 13, 2019

(65) Prior Publication Data

US 2020/0117847 A1 Apr. 16, 2020

Related U.S. Application Data

(62) Division of application No. 15/692,484, filed on Aug. 31, 2017, now Pat. No. 10,528,694.

(Continued)

(51) Int. Cl.
*G06F 17/50* (2006.01)
*H05K 1/02* (2006.01)
(Continued)

(52) U.S. Cl.
CPC .......... *G06F 30/392* (2020.01); *G06F 9/455* (2013.01); *G09B 23/186* (2013.01); *H01R 9/28* (2013.01);
(Continued)

(58) Field of Classification Search
CPC ........ G06F 30/392; G06F 13/00; G06F 9/455; G09B 23/186; H01R 9/28; H05K 1/0295;
(Continued)

(56) References Cited

U.S. PATENT DOCUMENTS 3,780,430 A 12/1973 Feeney
4,746,913 A 5/1988 Volta
(Continued)

FOREIGN PATENT DOCUMENTS

CN 2192924 Y 3/1995
CN 2545662 Y 4/2003
(Continued)

OTHER PUBLICATIONS

Chen et al. (Chinese Patent Document No. CN-201237988) published May 13, 2009, abstract and 1 drawing. (Year: 2009).*

(Continued)

*Primary Examiner* — Phallaka Kik
(74) *Attorney, Agent, or Firm* — Seyfarth Shaw LLP

(57) ABSTRACT

An electronic breadboard system may include a computing device including a display screen. The display screen has a first portion to display an electronic circuit model and a second portion directly adjacent to the first portion. The electronic breadboard system also includes a translucent breadboard on the second portion of the display screen. The translucent breadboard includes a translucent face plate having a rectangular grid of openings exposing a plurality of contacts. The plurality of contacts are arranged lengthwise along each row of the rectangular grid of openings and orthogonal to a transparent back plate coupling the plurality of contacts to the translucent face plate. The electronic breadboard system includes a graphics controller. The graphics controller may illuminate a row opening and/or a column opening of the translucent breadboard to direct placement of electrical components of a computer model in response to user interaction with the electronic circuit model.

16 Claims, 17 Drawing Sheets

Related U.S. Application Data

(60) Provisional application No. 62/382,528, filed on Sep. 1, 2016.

(51) Int. Cl.

| | | |
|---|---|---|
| H05K 7/00 | (2006.01) | |
| H05K 3/00 | (2006.01) | |
| H01R 9/28 | (2006.01) | |
| G06F 30/392 | (2020.01) | |
| H05K 7/14 | (2006.01) | |
| G09B 23/18 | (2006.01) | |
| H05K 1/14 | (2006.01) | |
| G06F 9/455 | (2018.01) | |
| H05K 7/02 | (2006.01) | |
| H05K 3/30 | (2006.01) | |
| H05K 3/32 | (2006.01) | |
| G06F 13/00 | (2006.01) | |

(52) U.S. Cl.
CPC .............. *H05K 1/0295* (2013.01); *H05K 1/14* (2013.01); *H05K 3/306* (2013.01); *H05K 3/325* (2013.01); *H05K 7/026* (2013.01); *H05K 7/1441* (2013.01); *G06F 13/00* (2013.01); *H05K 3/0005* (2013.01); *H05K 2201/10189* (2013.01)

(58) Field of Classification Search
CPC .......... H05K 1/14; H05K 3/306; H05K 3/325; H05K 3/0005; H05K 7/026; H05K 7/1441; H05K 2201/10189
USPC ............ 716/136, 137; 361/704, 437; 703/14
See application file for complete search history.

(56) References Cited

U.S. PATENT DOCUMENTS

| | | | | |
|---|---|---|---|---|
| 6,793,541 | B2* | 9/2004 | Yamaguchi | H01R 12/58 439/567 |
| 7,405,867 | B2* | 7/2008 | Park | G02F 1/0121 359/237 |
| 8,898,607 | B2 | 11/2014 | AbdelAzim et al. | |
| 2006/0121372 | A1 | 6/2006 | Wolfman et al. | |
| 2007/0217179 | A1* | 9/2007 | Schoen | B29C 70/84 361/837 |
| 2009/0015281 | A1* | 1/2009 | Yoshioka | G01R 31/2891 324/755.01 |
| 2011/0123147 | A1* | 5/2011 | Sameshima | G02B 6/43 385/14 |
| 2013/0201712 | A1 | 8/2013 | Fadel et al. | |
| 2016/0360613 | A1* | 12/2016 | Kho | H05K 1/11 |

FOREIGN PATENT DOCUMENTS

| | | |
|---|---|---|
| CN | 2558031 Y | 6/2003 |
| CN | 2616972 Y | 5/2004 |
| CN | 201226200 Y | 4/2009 |
| CN | 201655112 U | 11/2010 |
| CN | 202871158 U | 4/2013 |
| CN | 103093672 A | 5/2013 |
| CN | 203070636 U | 7/2013 |
| CN | 203838935 U | 9/2014 |
| CN | 104424836 A | 3/2015 |
| CN | 204360666 U | 5/2015 |
| CN | 204516188 U | 7/2015 |
| CN | 204740785 U | 11/2015 |
| JP | 09321261 A * | 12/1997 |
| JP | 2011028192 A | 2/2011 |
| KR | 20030008017 A | 1/2003 |
| KR | 101565836 B1 | 11/2015 |

OTHER PUBLICATIONS

Chen (Chinese Patent Document No. CN-203644615), published Jun. 11, 2014, abstract and 1 drawing. (Year: 2014).*

Zhao (Chinese Patent Document No. CN-203984791), published Dec. 3, 2014, abstract and 1 drawing. (Year: 2014).*

You (Chinese Patent Document No. CN-205430773), published Aug. 3, 2016, abstract and 1 drawing. (Year: 2016).*

* cited by examiner

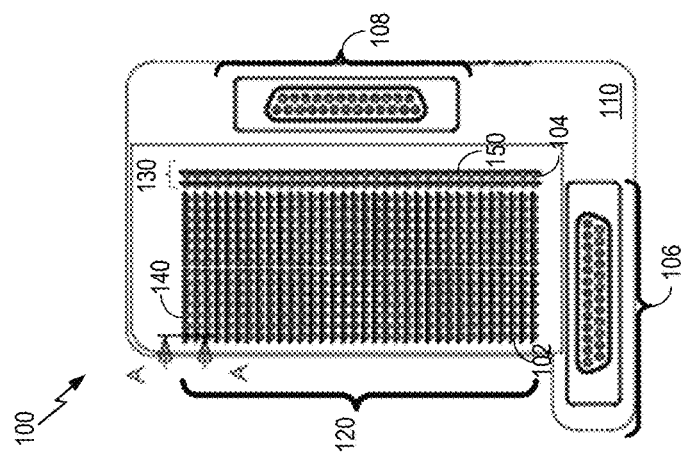
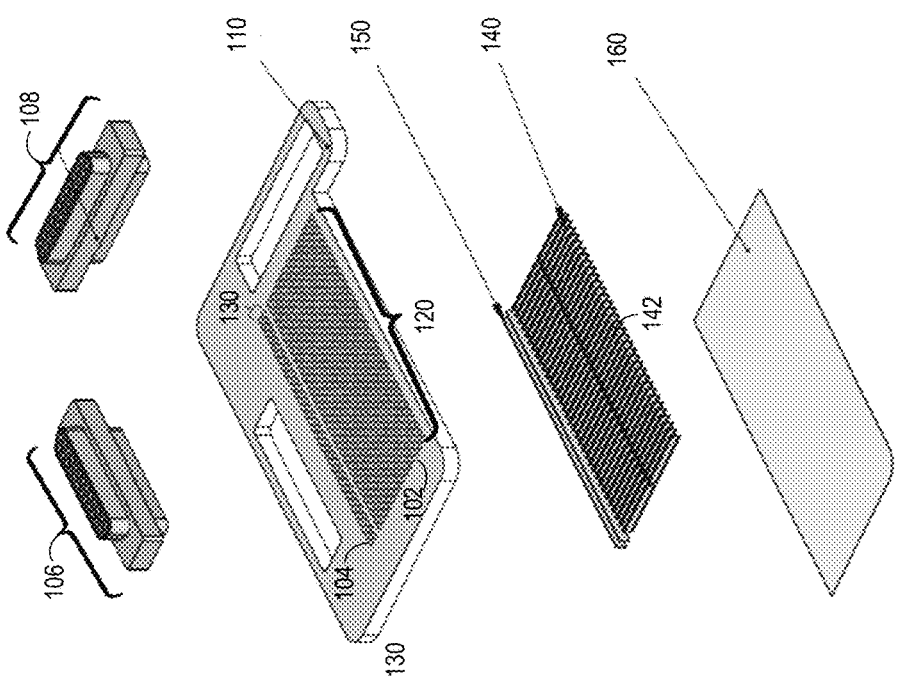
FIG. 2B
FIG. 2A

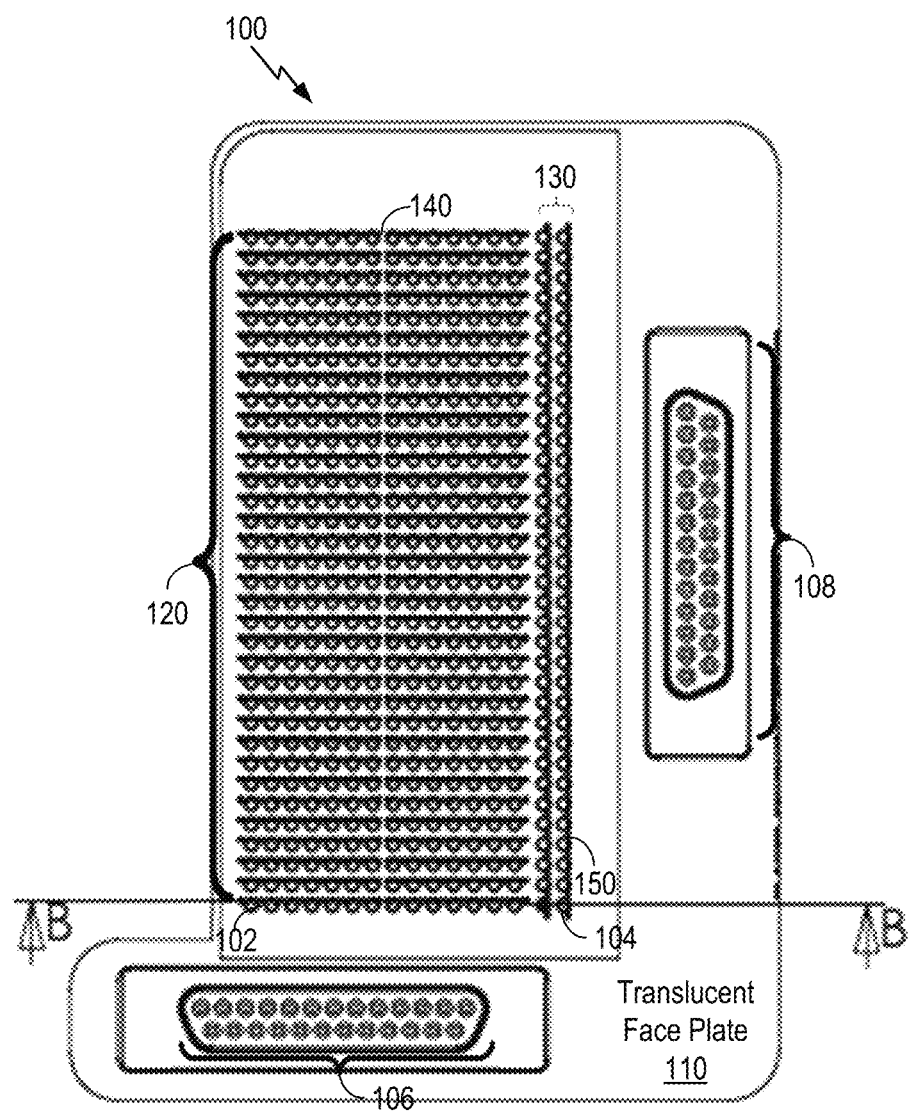
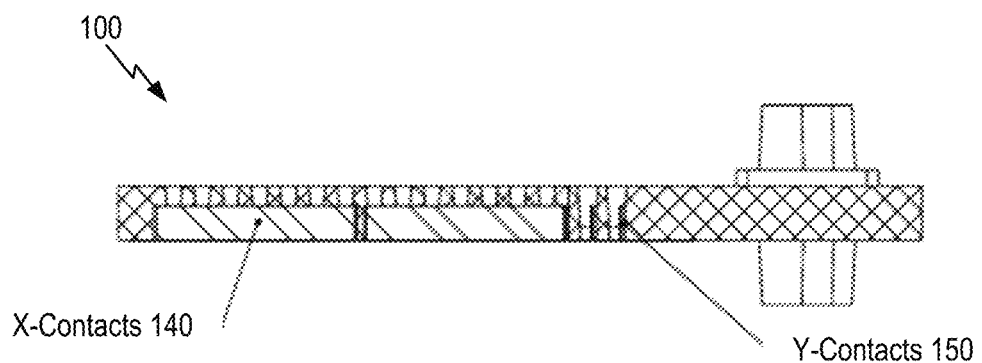
FIG. 3C

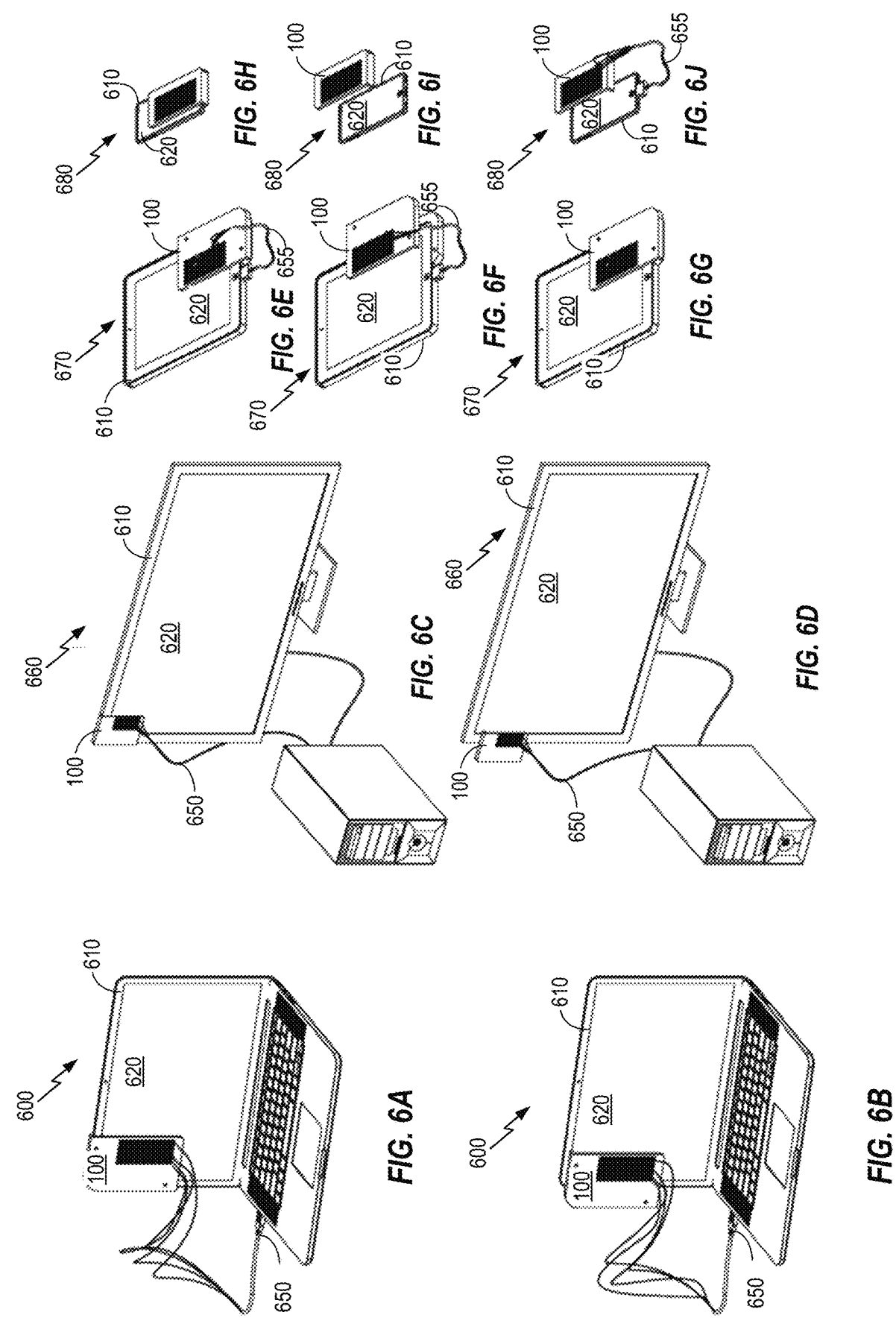

FIG. 8D Backing sheet goes over the LCD

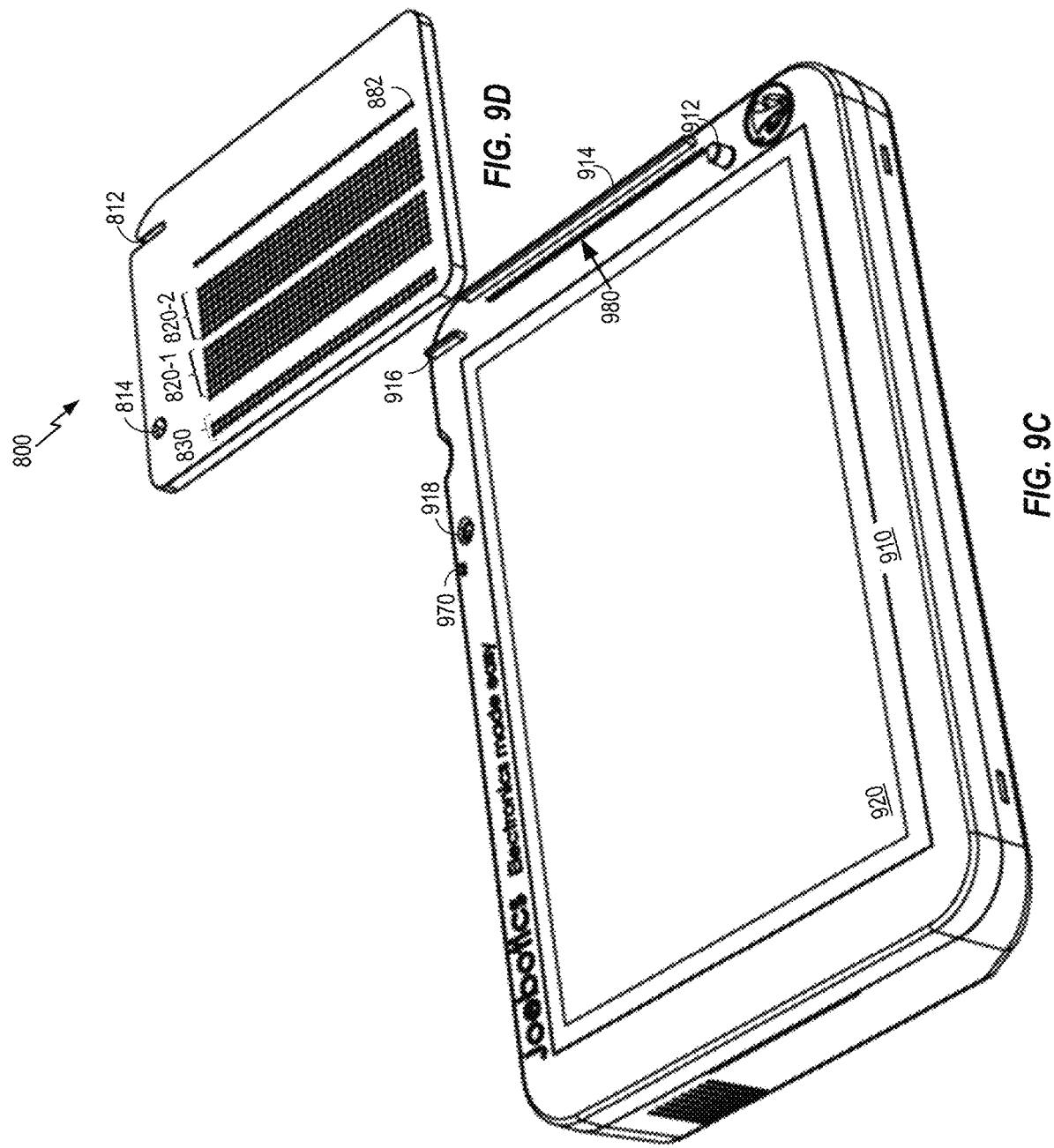

BREADBOARD AND ELECTRONICS EXPERIMENTATION SYSTEM

CROSS-REFERENCE TO RELATED APPLICATION

The present application is a divisional of U.S. patent application Ser. No. 15/692,484, filed on Aug. 31, 2017, and titled "BREADBOARD AND ELECTRONICS EXPERIMENTATION SYSTEM," and claims the benefit of U.S. Provisional Patent Application No. 62/382,528, filed on Sep. 1, 2016, and titled "BREADBOARD AND ELECTRONICS EXPERIMENTATION SYSTEM," the disclosures of which are expressly incorporated by reference herein in their entireties.

BACKGROUND

Field

This application relates to circuit design and, more specifically, to a breadboard and electronics experimentation system.

Background

A breadboard is generally defined as a board for making an experimental model of an electric circuit. In general, the breadboard is used as a foundation to prototype a circuit. That is, a breadboard may be used as a construction base for building a working prototype of an electronic circuit. The term breadboard is derived from the actual use of a wooden bread board as a construction base for connecting electronic components into an electronic circuit. Today, the term "breadboard" is associated with solderless breadboards that enable connection of electrical component pins within solder deposition, which makes these breadboards reusable. Reusability is important for creating temporary prototypes and experimenting with circuit design. Solderless breadboards are, therefore, extremely popular with students in technological education.

In operation, the breadboard provides an apparatus to connect various circuit elements and power sources together according to an electronic model. Conventionally, external test instruments may be connected to the circuit for determining a circuit characteristic at any particular point. Unfortunately, breadboards are passive devices that do not provide any guidance for interconnecting the circuit components and power source(s) to build a working prototype. Consequently, wiring of the circuit components on the breadboard may be erroneous, leading to a malfunctioning circuit.

SUMMARY

An electronic breadboard system may include a computing device including a display screen. The display screen has a first portion to display an electronic circuit model and a second portion directly adjacent to the first portion. The electronic breadboard system also includes a translucent breadboard on the second portion of the display screen. The translucent breadboard includes a translucent face plate having a rectangular grid of openings exposing a plurality of contacts. The plurality of contacts are arranged lengthwise along each row of the rectangular grid of openings and orthogonal to a transparent back plate coupling the plurality of contacts to the translucent face plate. The electronic breadboard system includes a graphics controller. The graphics controller may illuminate a row opening and/or a column opening of the translucent breadboard to direct placement of electrical components of a computer model in response to user interaction with the electronic circuit model.

A method for using a translucent breadboard may include accessing an electronic file that provides a description of a plurality of electrical components and a plurality of component connections to form a circuit in which a user is experimenting. The method may also include obtaining information regarding a size and spacings of openings within the translucent breadboard for initializing, registering and/or aligning the translucent breadboard on a display screen. The method may further include mapping the plurality of electrical components and the plurality of component connections as defined in the electronic file, to a set of breadboard openings arranged to expose contacts in individual ones of the set of breadboard openings. The method may also include translating the set of breadboard openings and the plurality of component connections to display coordinates for illuminating traces and spots on the display screen, in view of the aligning.

A non-transitory computer readable medium comprising instructions, which when executed to perform a method. The method may include sending a circuit wiring connection layout comprising a visual representation of circuit elements. The method may also include receiving a selection of a circuit element. The method may further include sending to a display screen a signal to illuminate a portion of the display screen beneath a translucent breadboard indicating where a user should place a selected circuit element on the translucent breadboard.

An electronic breadboard system may include a computing device including a display screen. The display screen has a first portion to display an electronic circuit model and a second portion directly adjacent to the first portion. The electronic breadboard system also includes a translucent breadboard on the second portion of the display screen. The translucent breadboard includes a translucent face plate having a rectangular grid of openings exposing a plurality of contacts. The plurality of contacts are arranged lengthwise along each row of the rectangular grid of openings and orthogonal to a transparent back plate coupling the plurality of contacts to the translucent face plate. The electronic breadboard system includes means for illuminating a row opening and/or a column opening of the translucent breadboard to direct placement of electrical components of a computer model in response to user interaction with the electronic circuit model.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

FIG. 2A is an exploded view of the contents of the translucent breadboard of FIG. 1A, according to aspects of the present disclosure.

FIG. 2B is a top view of the translucent breadboard of FIG. 1A, including a side view of the X-contacts, according to aspects of the present disclosure.

FIG. 3C is a cross-section view along an edge of the translucent breadboard, showing X-contacts and Y-contacts within Section B-B', according to aspects of the present disclosure.

FIGS. 6A-6J show the translucent breadboard of FIG. 3E connected to various computing devices and display screens, including laptop computers, desktop computers, computer monitors, tablet computers and mobile devices, according to aspects of the present disclosure.

FIG. 8D is a long edge view of the breadboard of FIG. 8A, according to aspects of the present disclosure.

FIGS. 9A-9D are perspective views of the translucent breadboard used with a computing device to form an electronic breadboard system, according to aspects of the present disclosure.

DETAILED DESCRIPTION

Figure 1C:
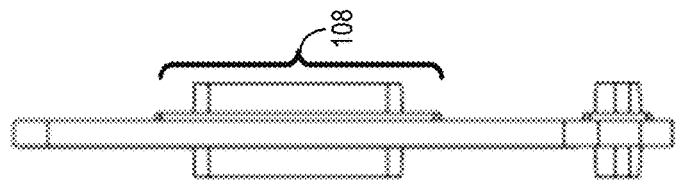
FIG. 1C is a long edge view of the breadboard of FIG. 1A, according to aspects of the present disclosure.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts.

As described herein, the use of the term "and/or" is intended to represent an "inclusive OR", and the use of the term "or" is intended to represent an "exclusive OR". As described herein, the term "exemplary" used throughout this description means "serving as an example, instance, or illustration," and should not necessarily be construed as preferred or advantageous over other exemplary configurations. As described herein, the term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches. As described herein, the term "proximate" used throughout this description means "adjacent, very near, next to, or close to." As described herein, the term "on" used throughout this description means "directly on" in some configurations, and "indirectly on" in other configurations.

A breadboard is generally defined as a board for making an experimental model of an electric circuit. That is, a breadboard may be used as a construction base for building a working prototype of an electronic circuit. Unfortunately, breadboards are passive devices that do not provide any guidance for interconnecting the circuit components and power source to build a working prototype. Consequently, wiring of the circuit components on the breadboard may be erroneous, leading to a malfunctioning circuit.

In aspects of the present disclosure, a breadboard of an electronics experimentation system allows its user to precisely place electronic components onto the breadboard by using a computing device's display screen as a guide to such components' placement. Other configurations of a breadboard and electronics experimentation system are also described.

In general, aspects of the present disclosure provide a see-through (e.g., translucent) breadboard, and a method and system for using the breadboard. Specifically, aspects of the present disclosure direct a user's placement of electronic components on a translucent breadboard by using objects being displayed on a display screen that is immediately adjacent and behind the breadboard. The displayed objects are visible to the user in front of the breadboard.

According to aspects of the present disclosure, a graphical user interface ("GUI") is controlled by an electronics simulation and experimentation program to display visual images (objects) of an electronic circuit. These displayed objects represent, and may even resemble, wire traces and electrical components, including their electrical terminals or pins that together form the electronic circuit. The electronic circuit is realized once the user inserts the actual electrical components and wire segments into openings of the breadboard that are located immediately or directly adjacent to the displayed objects.

In addition to displaying the electronic circuit, user interaction with the displayed electronic circuit is tracked for illuminating the locations (e.g., a row opening and/or a column opening) in the breadboard where wire segments and components (their terminals or pins) are to be inserted. In this aspects of the disclosure, a mapping process is performed between an electronic component's physical layout and the abstraction represented by the electronic component in the diagram displayed by the electronics simulation and experimentation program. Consequently, these locations are easily visible from above the breadboard, allowing the user to precisely insert the terminals or pins of the electronic components into the breadboard's face plate. Illuminating the breadboard row/column opening helps guide the electrical connection of the electronic circuit terminals and wire segments in a correct manner, which helps reduce connection mistakes.

Thus, an object representing an electrical circuit/network node or trace or component terminal or footprint is displayed on the screen directly adjacent to the breadboard (and that is also visible to the naked eye by the breadboard's user). As the user interacts with the displayed electrical circuit, an area of the display screen directly below the breadboard is illuminated to provide a visual guide for properly placing the actual electronic components and wire segments onto the breadboard. That is, circuit is guided by illuminating locations of the translucent breadboard for placing a circuit element in electrical contact with ones of the contacts by illuminated openings visible to the user through the translucent breadboard. In this manner, the placement of components and wire segments on the breadboard is more likely to be accurate.

A breadboard and electronics experimentation system may be composed of a translucent breadboard and a computing device with a display screen (e.g., a tablet computer running a GUI, a desktop computer connected to a dedicated monitor, or the like). In this arrangement, light from the display screen on one side of the translucent breadboard can sufficiently pass through a transparent back plate of the translucent breadboard and out the translucent face plate having a rectangular grid of openings. The light from the display screen is visible to a naked eye for precisely illuminating a set of one or more openings of the translucent breadboard.

In this example, the illuminated openings are used for receiving a wire segment that corresponds to an electrical trace or the component terminals of an electrical component being inserted into the openings. The display screen may also simultaneously display a circuit schematic in a part of the screen that is not covered by the translucent breadboard. The electrical trace or component corresponding to the wire segment and components terminals to be inserted, are highlighted or contrasted (relative to the rest of the circuit schematic) to build the circuit schematic. An exemplary breadboard and electronics experimentation system is shown, for example, in FIGS. 5B-5D.

As described herein, an electronic component is any physical component that is used to affect the movement of electrons. The electronic component includes one or more terminals to connect to other electronic components. For example, the electronic component may be a resistor, capacitor, inductor, transistor, diode, integrated circuit, switch, operational amplifier, voltage source, current source, or any other electronic component.

Figure 1A:
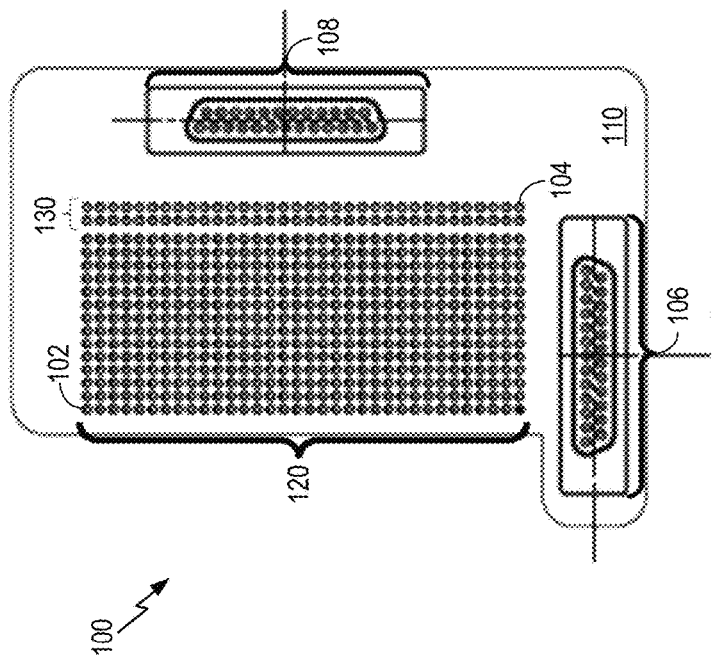
FIG. 1A is a top view of a configuration of a breadboard, according to aspects of the present disclosure.
Figure 1B:
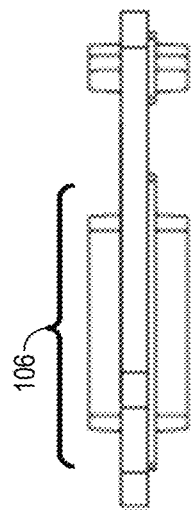
FIG. 1B is a short edge view of the breadboard of FIG. 1A, according to aspects of the present disclosure.

FIG. 1A shows a diagram of the top view of an example translucent breadboard 100 in accordance with one or more aspects of the present disclosure. FIG. 1B shows a short edge view of the translucent breadboard 100. FIG. 1C shows a long edge view of the translucent breadboard 100, in aspect of the present disclosure.

As shown in FIG. 1A, the translucent breadboard 100 includes a translucent face plate 110 having a rectangular grid 120 of first openings 102. The first openings 102 are arranged as rows for placement of electronic component pins and wires for forming an electronic circuit. The translucent face plate 110 also includes the columns 130 of second openings 104 for connecting, for example, a power supply. The translucent breadboard 100 also includes a first two-side female connector 106 and a second two-sided female connector 108. The first openings 102 and the second openings 104 of translucent face plate 110 may expose contacts as further illustrated in FIGS. 2A and 2B.

FIG. 2A is an exploded view of the contents of the translucent breadboard 100 of FIG. 1A, according to aspects of the present disclosure. In this configuration, the translucent breadboard 100 is composed of the translucent face plate 110 (e.g., electrically insulated plate) having the rectangular grid 120 of the first openings 102 and the columns 130 of the second openings 104 formed therein. Although described as translucent, it should be recognized that the translucent breadboard 100 of FIG. 1A may also include a transparent face plate in combination with a transparent back plate 160 to form a transparent breadboard, according to aspects of the present disclosure.

Referring again to FIG. 2A, the translucent breadboard 100 includes a contact layer that is composed of at least two elongated conductive contacts in a Y-direction, referred herein as Y-contacts 150. The Y-contacts 150 are each oriented as a column that runs behind the columns 130 of the second openings 104 in the translucent face plate 110. The Y-contacts 150, which may serve as a power supply rail (e.g., a bus strip), are arranged orthogonally to translucent face plate 110 for allowing light from the display screen to emanate from the second openings 104. The contact layer also includes several rows of conductive, elongated contacts (e.g., arranged in an X-direction perpendicular to the Y-direction), referred to herein as X-contacts 140.

In this aspect of the present disclosure, the X-contacts 140 are each oriented as a row (e.g., 142), behind each respective row of the first openings 102 in the rectangular grid 120. In this arrangement, the X-contacts 140 connect to the terminals of electronic components and wire segments installed on the translucent breadboard 100 (e.g., terminal strips) for forming an electronic circuit. The translucent breadboard 100 also includes a transparent, electrically insulating backing (e.g., a transparent back plate 160) for securing the contact layer, including the x-contacts 140 and the y-contacts 150 to the translucent face plate 110.

In this arrangement, the x-contacts 140 and the y-contacts 150 are arranged orthogonally to the transparent back plate 160 for allowing light from the display screen to emanate from the first openings 102 and the second openings 104. In addition, the transparent back plate 160 serves to close off a bottom end of the first openings 102 in the rectangular grid 120, as well as the second openings in the columns 130. In this example, an opposing face of the translucent face plate 110 is etched to form receptacle channels for retaining the X-contacts 140 and the Y-contacts 150. In this example, the X-contacts 140 and the Y-contacts 150 are held in the translucent plate's receptacle channels by the transparent back plate 160.

The translucent breadboard 100 may also be configured so that a first set of the X-contacts 140 that are a subset of a second set of the X-contacts 140 in the translucent breadboard 100 are to be electrically connected to a set of connector contacts of a computing device (e.g., FIGS. 6A to 6J). In this manner, the first set of X-contacts 140 may serve to electrically connect the terminals of an electronic component that has been inserted into the first openings 102 of the translucent breadboard 100 (which openings are aligned with the first set of the X-contacts 140, respectively), to a computing device (not shown). This connection allows a program running in the computing device to communicate with the electronic component that is on the translucent breadboard 100. The translucent breadboard 100 may be composed of acrylonitrile butadiene styrene (ABS) plastic, polycarbonate plastic, silicone, glass, or other like material.

FIG. 2B is a top view of the translucent breadboard 100, including a side view of the X-contacts 140 according to aspects of the present disclosure. In this arrangement, the X-contacts 140, of the rectangular grid 120 and the Y-contacts 150 of the columns 130 are orthogonal to the translucent face plate 110, such that light emanates through the first openings 102 and the second openings 104. As further illustrated in FIG. 2B, section A-A' highlights a subset of rows in the rectangular grid 120 to further illustrate the orthogonal arrangement of the X-contacts 140 relative to the translucent face plate 110, as further illustrated in FIG. 3A.

Figure 3B:
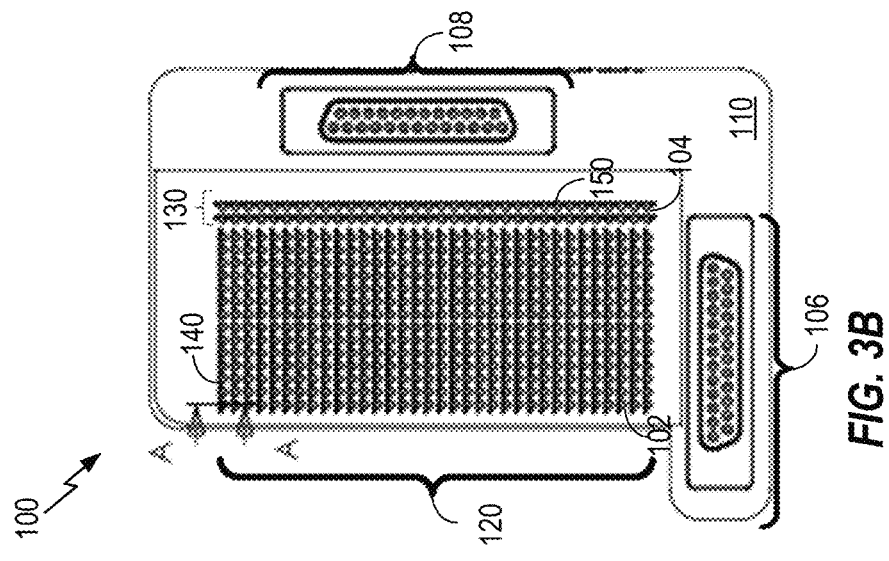
FIG. 3B is a top view of the translucent breadboard of FIG. 1A, showing section A-A', which is further illustrated in FIG. 3A, according to aspects of the present disclosure.
Figure 3A:
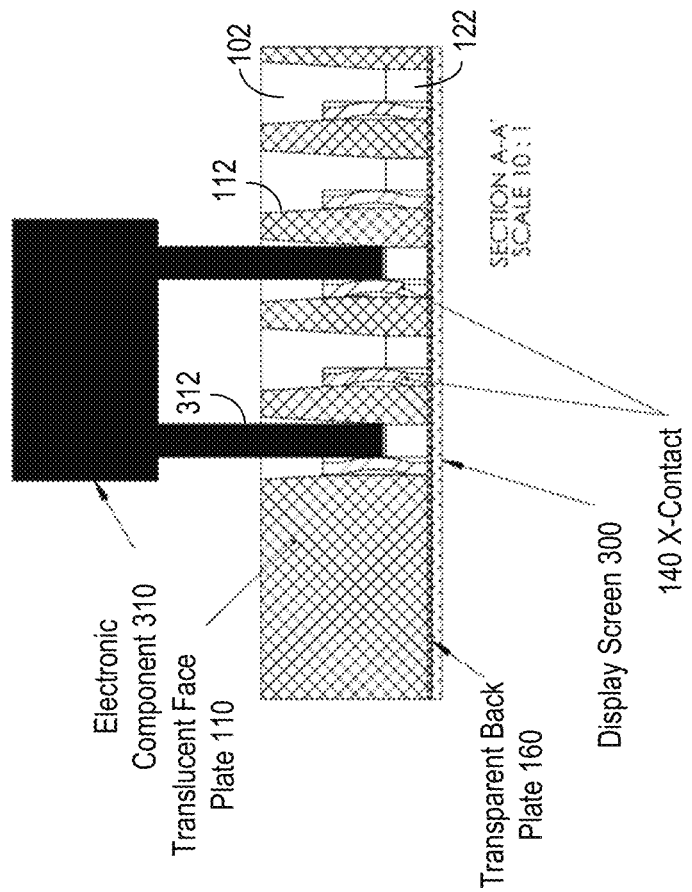
FIG. 3A is a cross-section view along an edge view of the translucent breadboard, further illustrating the X-contacts, according to aspects of the present disclosure.

FIG. 3A is a cross-section, exploded view of an edge of the translucent breadboard 100 along section A-A' of FIG. 3B, showing an electronic component 310 placed on in the first openings 102 and secured by the X-contacts 140, according to aspects of the present disclosure. FIG. 3B is a top view of the translucent breadboard of FIG. 1A, showing section A-A', which is further illustrated in FIG. 3A, according to aspects of the present disclosure.

FIG. 3A is a cross-section of the translucent breadboard 100 (and an enlarged view of section A-A', shown in FIG. 3B) that diagrams how terminals 312 (e.g., pins) of an electronic component 310 fit within the first openings 102 of the translucent face plate 110 for contacting the X-contacts 140 of the translucent breadboard 100. Also shown in FIG. 3A at A-A' is the transparent back plate 160 of the translucent breadboard 100, which is on the face of a display screen 300 and parallel thereto. It should be recognized that a surface of the transparent back plate 160 may or may not abut, but is adjacent to the display screen 300. In this arrangement, an illuminated object on the display screen indicating, for example, the location of a trace or the terminals 312 of an electronic component 310 is visible to a user through the first openings 102 with the naked eye and without the need for magnification, prior to connecting the electronic component 310.

In the configuration shown in the FIGS. 3A and 3B, the translucent breadboard 100 includes the translucent face plate 110 fixed to the transparent back 160. The translucent face plate 110 may be composed of a translucent, electrically insulating plate having a grid of holes (e.g., the first openings 102) formed therein. The first openings 102 in the translucent face plate 110 exposes the X-contacts 140 that are fixed to a sidewalls 112 of the first openings 102, within X-receptacle channels 122 at a base of the first openings 102. The X-contacts 140 may be oriented as a row behind a respective row of the first openings 102 in the rectangular grid 120 connecting the terminals (e.g., 312) of the electronic components (e.g., 310) and wire segments (not shown) installed on the translucent breadboard 100 (e.g., terminal strips). In this configuration, the X-contacts 140 are placed in the X-receptacle channels 122, orthogonal to the transparent back plate 160 to enable light from the display screen 300 to emanate from the first openings 102.

FIG. 3C is a cross-section view along an edge of the translucent breadboard 100, showing the X-contacts 140 and the Y-contacts 150 within Section B-B', according to aspects of the present disclosure. In this configuration, the Y-contacts 150 are each oriented as a column that runs behind its respective column of the columns 130 of the second openings 104 and that may serve as a power supply rail (e.g., a bus strip). The columns 130 of the second openings 104 are also orthogonal to the rows of the X-contacts 140 within the rectangular grid 120 of the first openings 102.

Figure 3D:
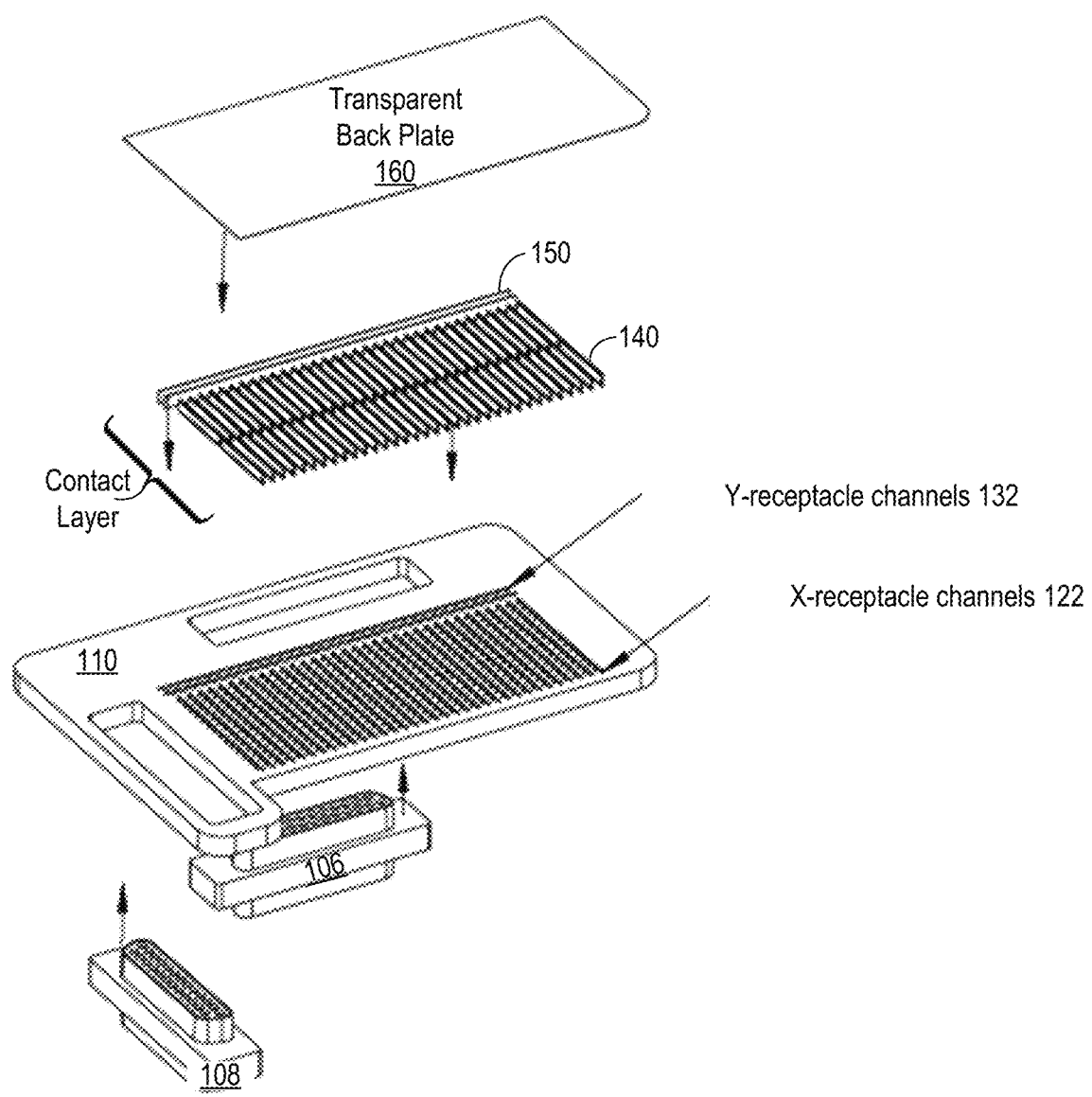
FIG. 3D is an exploded, bottom-up view of the contents of the translucent breadboard of FIG. 1A, according to aspects of the present disclosure.

FIG. 3D is an exploded, bottom-up view of the contents of the translucent breadboard 100 of FIG. 1A, according to aspects of the present disclosure. The translucent breadboard 100 includes the transparent back plate 160 (e.g., a transparent, electrically insulating backing) for securing the contact layer, including the X-contacts 140 and the Y-contacts 150 to the translucent face plate 110.

In this arrangement, a bottom face of the translucent face plate 110 is etched to form Y-receptacle channels 132 in which the Y-contacts 150 are retained. The bottom face of the translucent face plate 110 is also etched to form X-receptacle channels 122 in which the X-contacts 140 are retained. The X-contacts 140 and the Y-contacts 150 of the contact layer are held in place by within X-receptacle channels 122 and the Y-receptacle channels 132 of the translucent face plate 110 by the transparent back plate 160.

Figure 3E:
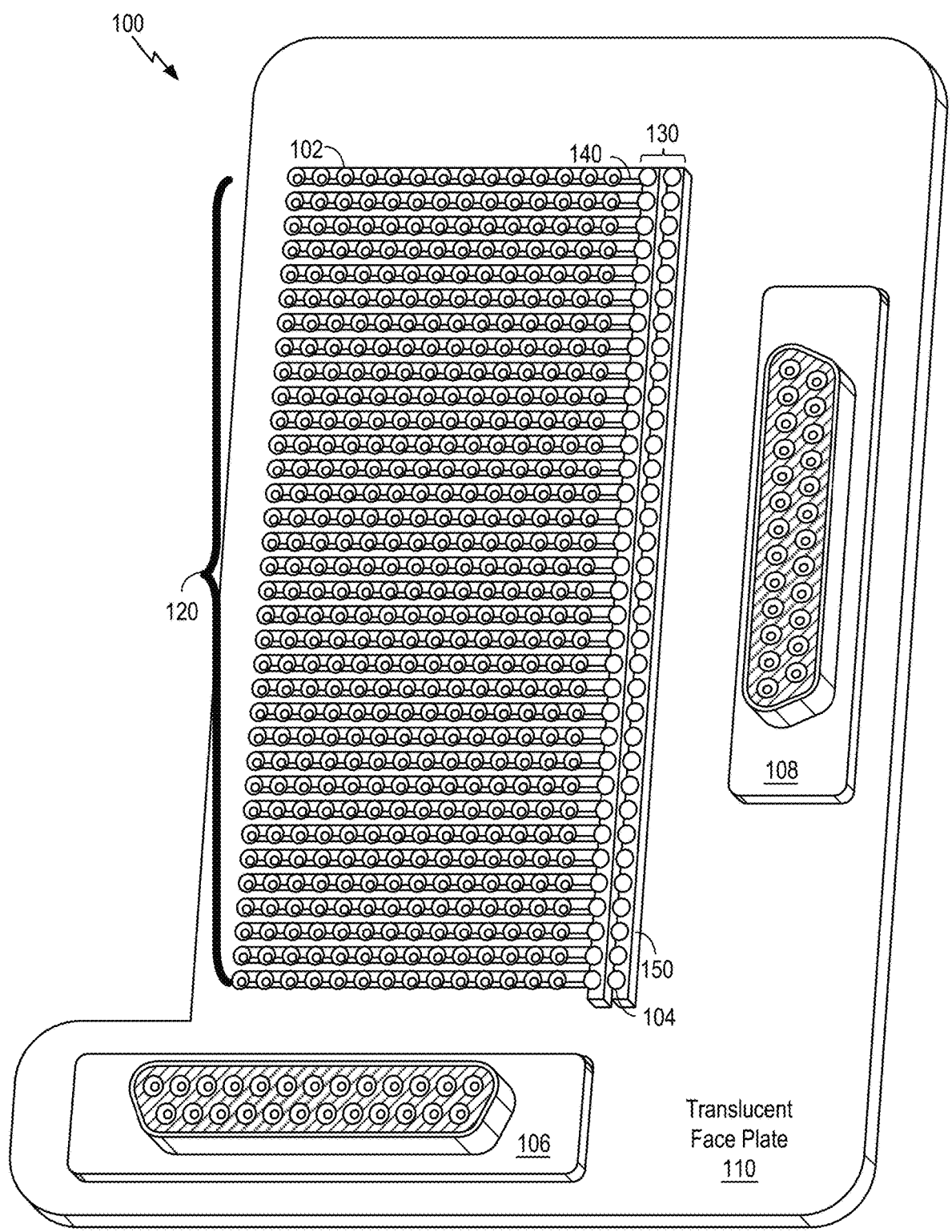
FIG. 3E is a 3D view of the translucent breadboard of FIG. 1A, further illustrating the X-contacts and the Y-contacts according to aspects of the present disclosure.

FIG. 3E is a 3D view of the translucent breadboard 100 of FIG. 1A, further illustrating the X-contacts 140 and the Y-contacts 150 according to aspects of the present disclosure. Within the translucent face plate 110, there are horizontal channels formed as rows of the rectangular grid 120 of the first openings 102 and vertical channels formed as the columns 130 of the second openings 104. The X-contacts 140 line rows of the rectangular grid 120 and are exposed by the first openings 102. Similarly, the Y-contacts 150 line the columns 130 and are exposed by the second openings 104. In this arrangement, the X-contacts 140 and the Y-contacts 150 apply pressure upon the abutting terminals of electronic components to secure them within the translucent breadboard 100 by pressing the terminals 312 against channel walls (e.g., sidewalls 112) of the translucent face plate 110, as shown in FIG. 3A.

By contrast, conventional breadboards rely on spring clips that apply pressure upon the electronic components' terminals towards a center point behind the breadboard's openings. As a result, conventional spring clips do not allow a user to see through such conventional breadboards. In particular, a user is unable to see through conventional breadboards due to conventional spring clips, which are composed of horizontally extended segments (forming opaque rectangles in the back view of a conventional breadboard). That is, a conventional breadboard's spring clips pinch a wire or terminal from two sides, towards a center point behind the breadboards' openings, with the spring clips' backing plates preventing light from passing through the breadboard.

According to aspects of the present disclosure, the X-contacts 140 lining the channeled rows of the rectangular grid 120 and the Y-contacts 150 lining the columns 130 in the translucent breadboard 100 are mounted within the translucent face plate 110, orthogonal to the transparent back plate 160. In this orthogonal arrangement, the X-contacts 140 and the Y-contacts 150 are placed at the edges of their planes (e.g. upright), and are shaped to allow light that is coming into the translucent breadboard 100 from the transparent back plate 160 to pass and through the first openings 102 and/or the second openings 104 in the translucent face plate 110. Light from the first openings 102 and/or the second openings 104 in the translucent face plate 110 enters into the eyes of a user above the translucent breadboard 100 because the X-contacts 140 and the Y-contacts 150 do not have horizontally extended segments of spring contacts, which obscure a user's view through conventional breadboards.

The user's view through the translucent face plate 110 of the translucent breadboard 100 and through the transparent back plate 160 is unobscured, due to the vertically mounted edges of the X-contacts 140 and/or the Y-contacts 150. That is, light is able emanate through the translucent face plate 110 because X-contacts 140 and/or the Y-contacts 150 are formed using a thin strip which does not have a horizontally extending segment behind the first openings 102 and/or the second openings 104 formed in the translucent face plate 110. In other words, the X-contacts 140 and the Y-contacts 150 may be formed as a strip having a length, a width and a thickness, that is oriented, while positioned inside its respective channel (e.g., X-receptacle channels 122/Y-receptacle channels 132), so that its width direction is vertical while its length direction is horizontal (arranged lengthwise along the channel), and is sufficiently thin to not obscure the user's view, for example, as shown in FIG. 3A.

In one configuration, the strip structure of the X-contacts 140 and/or the Y-contacts 150 does not obscure the base portion of the X-receptacle channels 122/Y-receptacle channels 132 that is directly behind the terminal of a component or wire segment that is inserted into one of the first openings 102 or one of the second openings above the X-receptacle channels 122/Y-receptacle channels 132. The strip structure of the X-contacts 140 and the Y-contacts 150 allows the user to sufficiently resolve the periphery of an object that has been illuminated on the display screen 300 directly behind the translucent breadboard 100, as shown in FIG. 3A.

In aspects of the present disclosure, the translucent breadboard 100 is used with a computing device by affixing the translucent breadboard 100 to a display screen of the computing device. The translucent breadboard 100 is designed to be removed by a user without any tools. In this arrangement, a portion of the X-contacts 140 and the Y-contacts 150 of the translucent breadboard 100 overlay a screen of the computing device. The screen of the computing device may be configured to display a graphical user interface of an electronics experimentation software program executed by the computing device for non-smartphone configurations. The computing device may be one or more mobile devices, including but not limited to a laptop computer, tablet computer, smartphone, personal digital assistant, or other mobile device.

In one or more configurations, the translucent breadboard 100 does not have direct or electronically passive connection to a processor of the computing device or other circuits of the computing device. In one configuration, a peripheral device is connected between a port (e.g., universal serial bus (USB) or micro-USB) and the translucent breadboard 100. This peripheral device may enable the computing device to access the translucent breadboard 100 through general purpose input/output (GPIO) pins of the computing device. Also, in one configuration, no transistor-based devices or other active or passive electronic components are part of or built into the breadboard, and any external processing of the signals of the components on the breadboard occurs through the connector by the computing device. In other configurations, circuit components such as integrated circuits and passive elements (e.g., capacitors) may be interconnect into circuits using the translucent breadboard 100.

Figure 4:
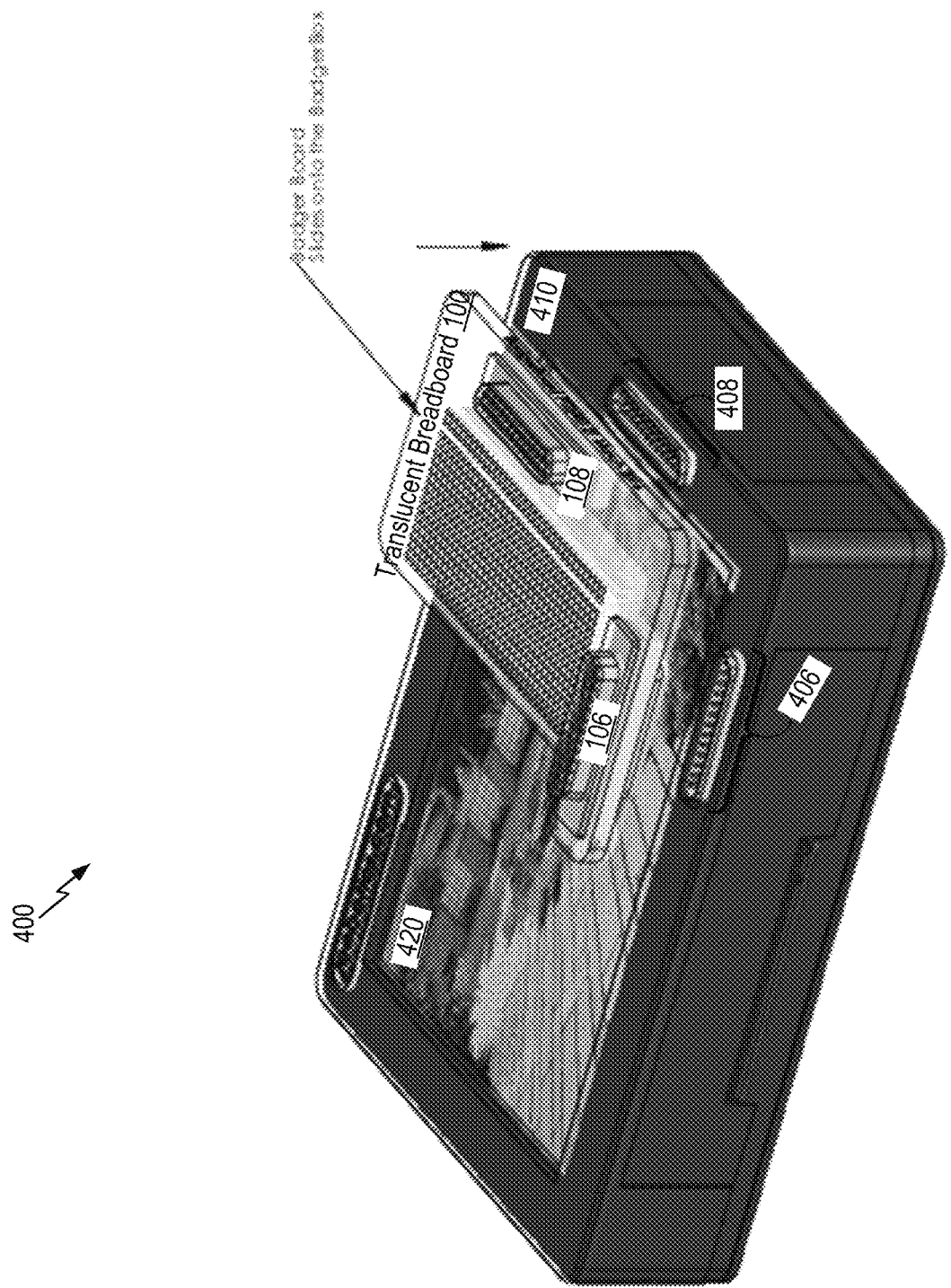
FIG. 4 provides a 3D view of the translucent breadboard of FIG. 3E, mounted on an exemplary computing device, according to aspects of the present disclosure.

FIG. 4 provides a 3D view of the translucent breadboard 100 of FIG. 3E, mounted on a computing device 400, according to aspects of the present disclosure. FIG. 4 shows one configuration of the translucent breadboard 100, having a first two-side female connector 106 and a second two-sided female connector 108 (e.g., two-side female DB25 connectors) that provide a wired electrical connection to a first mating connector 406 and a second mating connect 408 (e.g., male DB25 connectors) that are built into a computing device 400. In this example, the translucent breadboard 100 is affixed to a housing 410 of the computing device 400 in which the display screen 420 is also included.

Figure 5D:
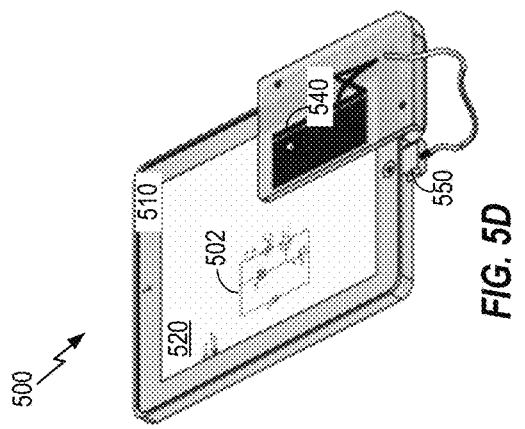
FIGS. 5B, 5C and 5D show a "user's eye" view of the translucent breadboard affixed to a computing device displaying the circuit schematic diagram of FIG. 5A, according to aspects of the present disclosure.
Figure 5C:
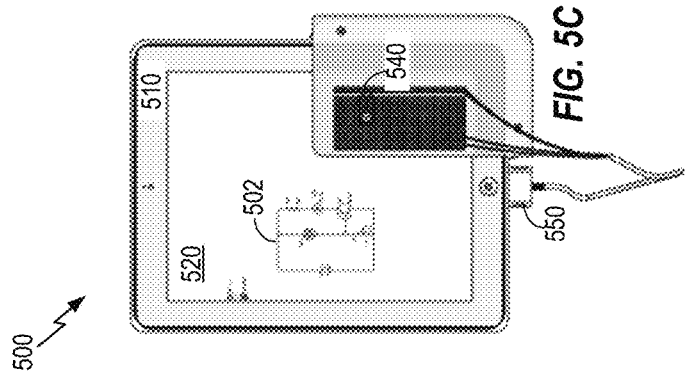
Figure 5B:
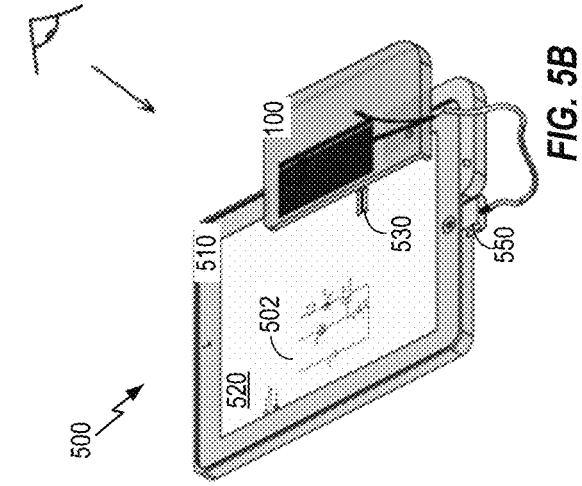
Figure 5A:
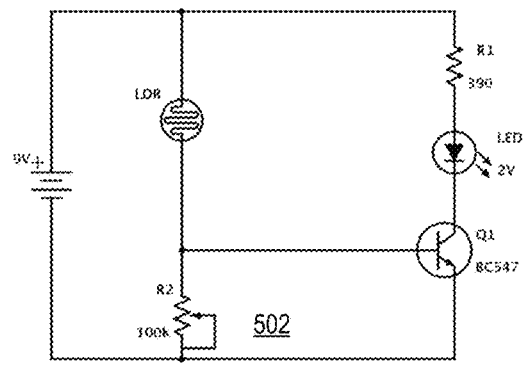
FIG. 5A shows a user's eye view of a schematic circuit diagram, as it might appear on a display of a computing device, according to aspects of the present disclosure.

FIG. 5A shows a user's eye view of a circuit schematic diagram 502, as it might appear on a display screen 520 of a computing device 500, according to aspects of the present disclosure. According to aspects of the present disclosure, a user is guided in forming a prototype of the circuit schematic diagram 502 on the translucent breadboard 100. For example, a graphics controller of the computing device 500 may illuminate a row opening and/or a column openings of the translucent breadboard 100 to direct placement of electrical components of a computer model in response to user interaction with the electronic circuit model on the display screen 520.

FIGS. 5B, 5C and 5D show a "user's eye" view of the translucent breadboard 100 affixed to the computing device 500 displaying the circuit schematic diagram 502 of FIG. 5A, according to aspects of the present disclosure. In this example, the circuit schematic diagram 502 is the subject of experimentation. The circuit schematic diagram 502 is displayed on a first portion of a display screen 520 within a housing 510 of the computing device 500. In this example, the translucent breadboard 100 is fitted to the lower right corner of the computing device 500, overlying a second portion of the display screen 520, adjacent to the first portion.

In FIG. 5B, two bars 530 are displayed on the display screen 520, below the translucent breadboard 100. In this example, the two bars 530 indicate the locations where two terminals of an electrical component that is highlighted in the circuit schematic diagram 502, are to be inserted by the user. The two bars 530 displayed on the display screen 520 are visible through the first openings (e.g., 102) of the translucent breadboard 100. That is, light emanating from the first openings is apparent to the user while looking downward at the top face of the breadboard. In FIGS. 5C and 5D, an electronic component 540 is affixed to an illuminated row of the translucent breadboard 100.

In these examples, the translucent breadboard 100 is configured to be affixed by its user to the computing device 500 and is to be electrically connected to the computing device with a connector 550 that is affixed to or integrated into the computing device 500. In addition, at least a portion of the X-contacts 140 and/or the Y-contacts 150 of the translucent breadboard 100 overlay the second portion of the display screen 520 of the computing device 500. The second portion is adjacent to the second portion of the display screen 520, displaying a graphical user interface ("GUI") of an electronics experimentation software program executed by the computing device 500.

FIGS. 6A-6J show the translucent breadboard 100 connected to various computing devices and display screens, including laptop computers, desktop computers, computer monitors, tablet computers and mobile devices, according to aspects of the present disclosure.

FIGS. 6A and 6B show one configuration of the translucent breadboard 100 configured for use with a laptop computer 600 through a wired connection 650, according to aspects of the present disclosure. In this example, the translucent breadboard 100 is shown using the wired connection 650 to the laptop computer 600. In FIG. 6A, the translucent breadboard 100 is mounted to the display screen 620 at a corner of the housing 610 of the laptop computer 600. In FIG. 6B, the translucent breadboard 100 is mounted to the display screen 620 at an edge of the housing 610. In these examples, the wired connection 650 is provided using a USB (universal serial bus) cable connected to a USB port of the laptop computer 600. This example shows four wires (e.g., voltage (V), ground (G), and differential data signals (D+ and D−)) connected between the translucent breadboard 100 and the USB port of the laptop computer 600.

FIGS. 6C and 6D show one configuration of the translucent breadboard 100 configured for use with a desktop computer 660 through the wired connection 650, according to aspects of the present disclosure. In this example, the translucent breadboard 100 is shown using the wired connection 650 to the desktop computer 660. In FIG. 6C, the translucent breadboard 100 is mounted to the display screen 620 at a corner of the housing 610 of the desktop computer 660. In FIG. 6D, the translucent breadboard 100 is mounted to the display screen 620 at an edge of the housing 610. In these examples, the wired connection 650 is also provided using a USB cable connection to the USB port of the desktop computer 660.

FIGS. 6E, 6F and 6G show configurations of the translucent breadboard 100 configured for use with a tablet computer 670 through a wired connection 655, according to aspects of the present disclosure. In these examples, the translucent breadboard 100 is shown using the wired connection 655 to the tablet computer 670. In FIG. 6E, the translucent breadboard 100 is mounted to the display screen 620 at a bottom right corner of the housing 610. In FIG. 6F, the translucent breadboard 100 is mounted to the display screen 620 at a right, bottom edge of the housing 610. In FIG. 6G, the translucent breadboard 100 is also mounted to the display screen 620 at a right, bottom edge of the housing 610. In these examples, the wired connection 655 is provided using a micro-USB cable connection to a micro-USB port of the tablet computer 670.

FIGS. 6H, 6I and 6J show configurations of the translucent breadboard 100 configured for use with a smartphone 680 through the wired connection 655, according to aspects of the present disclosure. In these examples, the translucent breadboard 100 is also shown using the wired connection 655 to the smartphone 680. In FIG. 6H, the translucent breadboard 100 is mounted to the display screen 620 at a bottom right corner of the housing 610. In FIG. 6I, the translucent breadboard 100 is mounted to the display screen 620 at a right, upper edge of the housing 610. In FIG. 6J, the translucent breadboard 100 is also mounted to the display screen 620 at a right, top edge of the housing 610. In these examples, the wired connection 655 is also provided using a micro-USB cable connection to a to a micro-USB port of the smartphone 680.

In at least one configuration, the translucent breadboard 100 is connected by wires on one end of the wired connection (e.g., a cable). The other end of the wired connection may be a multi-connector, digital communication cable, such as a USB connector. In this example, as a separate connector at the other end of the wired connection electrically connects a subset of the X-contacts and the Y-contacts (not shown) of the translucent breadboard 100 (FIGS. 6A to 6J). In at least one configuration, a multi-conductor, digital communications cable has a connector at one end that mates with a built-in connector of the computing device, and such cabling is housed (e.g., permanently attached) within the translucent breadboard 100. The other end is electrically connected to desired X-contacts and Y-contacts (not shown) on the breadboard (FIGS. 6G, 6H and 6I).

In one aspect of the present disclosure, the various computing devices (e.g., 600, 660, 670, 680) direct placement of the translucent breadboard 100 as follows. A breadboard placement process may begin by illuminating alignment points for placing the translucent breadboard on the display screen. In this example, the user aligns two demarcated points that are shown on the GUI as illuminated pixels on the display screen 620 that are visible to the user through the face plate of the translucent breadboard 100. Once aligned, the user can press a "Forward" button on the screen to indicate that the alignment process is complete.

While FIGS. 6A to 6J described various wired connections between the translucent breadboard 100 and the computing devices, aspects of the present disclosure are not limited to these wired connections. For example, the translucent breadboard 100 may be communicably coupled to a server associated with the computing device, using a wireless connection (e.g., a Wi-Fi connection). In this example, a wireless connection may be used to direct layout placement of the translucent breadboard 100 on the display screen of the computing device. This process may be used to enable the computing device to detect the location of the translucent breadboard on a display screen. In addition, user interaction with a circuit schematic may be communicated to the computing device via the associated server to enable illumination of the openings within the translucent breadboard for electronic component and wire placement.

In at least one configuration, an electronic experimentation software being executed by the computing device (e.g., 600, 660, 670, 680) allows the user to create, edit, save, and load circuit diagrams from files, either residing on a local disk or available through any standard network socket or protocol (e.g., transmission control protocol (TCP), user datagram protocol (UDP), etc.). The user may add and remove schematic elements, and assemble them into circuits which can be tested and probed virtually. When the components that make up a circuit (i.e., the wires, sensors, chips, capacitors, resistors, etc.) are assembled into a circuit, and the circuit is working, then the software may allow the user to create a physical representation of the circuit on the translucent breadboard 100. For example, the software may present the user with a series of steps to create a working circuit on the translucent breadboard 100. This may be achieved, for example, by conveying a series of steps to the user, each step detailing either the placement of a component or the placement of an end of a wire into the translucent breadboard 100.

According to aspects of the present disclosure, the placement of a component or the placement of an end of a wire into the translucent breadboard 100 is specified by illuminating pixels on the display screen 620 beneath the row(s) of openings in the translucent breadboard 100 into which a component or wire ends are placed. The user may be optionally presented with contextual information regarding the specifics of the orientation of a component. For example, this information may be presented visually, as text, or in combination. Once the complete circuit schematic is arranged on the translucent breadboard 100, the electronic experimentation software may receive a circuit characteristic from the translucent breadboard, by obtaining a measurement associated with the circuit characteristic. In this example, an oscilloscope may be integrated within an enclosure for attached the translucent breadboard to the computing device, for obtaining the measurement.

Figure 7:
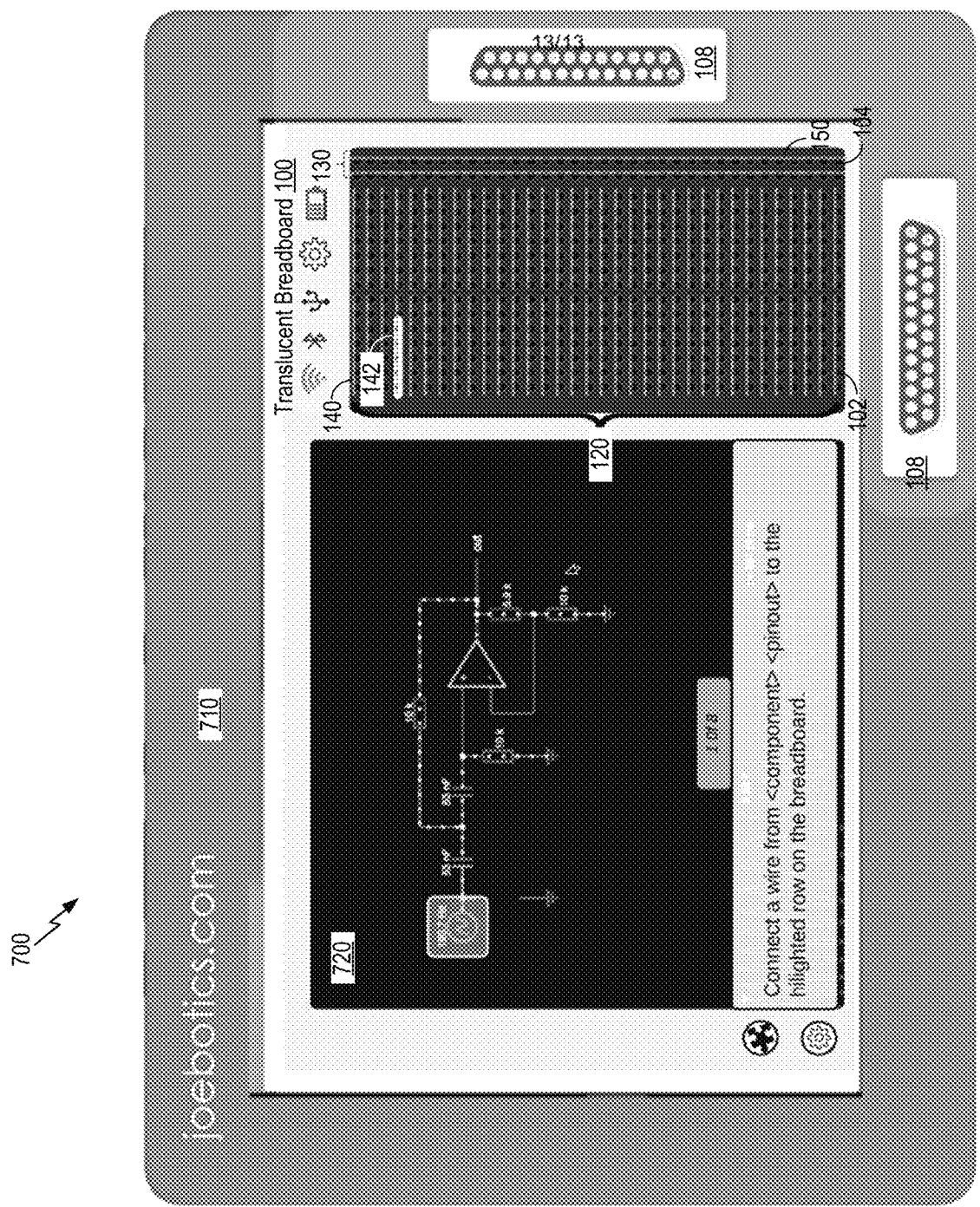
FIG. 7 is a wireframe image showing a user's view of the translucent breadboard of FIG. 3E used with an example computing device providing instruction to its user regarding electronic component placement, in graphical and text formats, according to aspects of the present disclosure.

FIG. 7 is a wireframe image of the translucent breadboard 100 used with a computing device 700 to form an electronic breadboard system, according to aspects of the present disclosure. FIG. 7 shows a user's view of the translucent breadboard 100 attached to a housing 710 of the computing device 700. In this example, instructions are provided to the user for placing electronic components in the rectangular grid 120 of the first openings 102 and/or the columns 130 of the second openings 104 of the translucent face plate of the translucent breadboard 100. As shown in the portion of a display screen 720 adjacent to the translucent breadboard 100, the user is directed to "Connect a wire from <component><pinout> to the highlighted row on the breadboard" in text format. The text may be generated by an algorithm or the text may be overwritten by configuration in a schematic file. The user responds by placing circuit elements within one of the first openings 102 in the highlighted row 142 illuminated by points visible to the user through the translucent face plate of the translucent breadboard 100. (See FIGS. 5B, 5C and 5D).

Figure 8A:
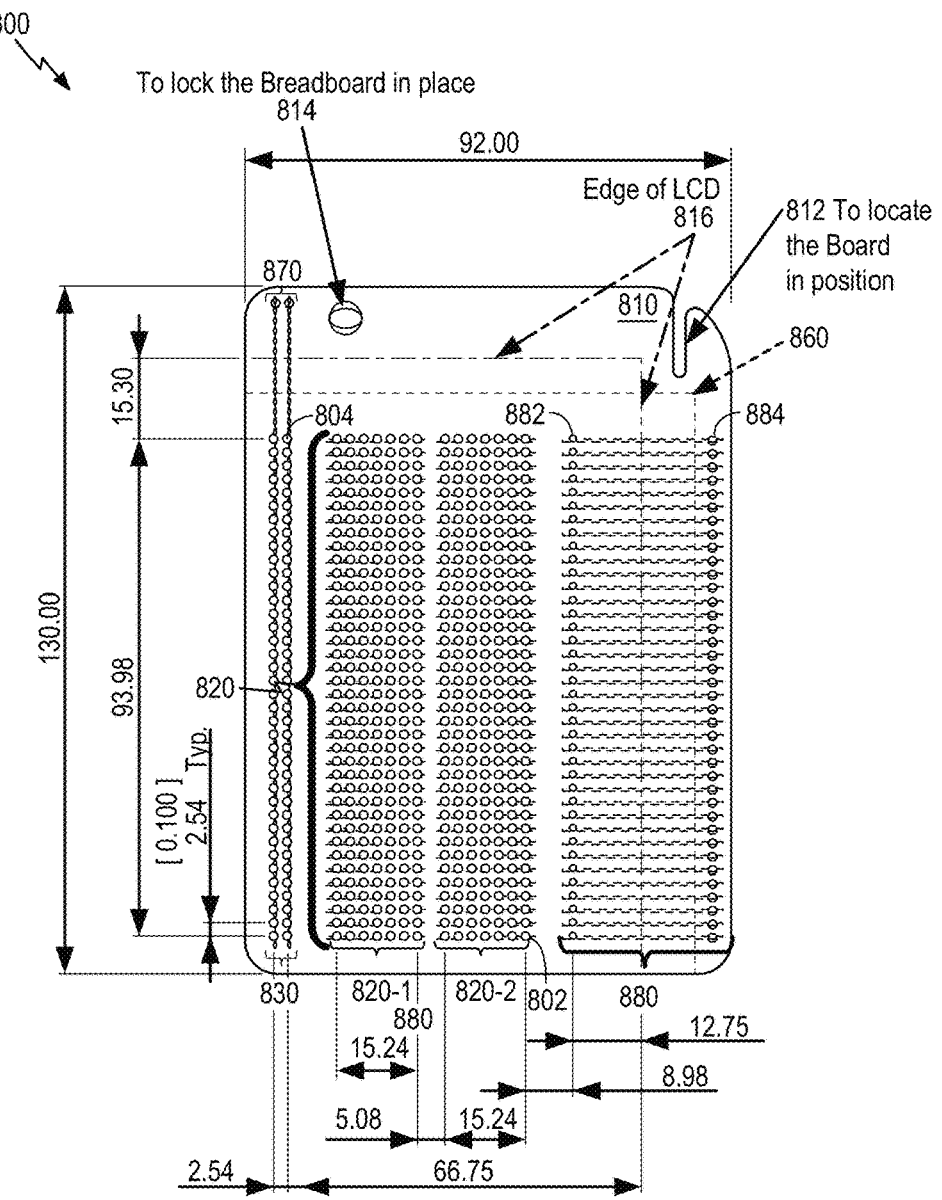
FIG. 8A is a top view of a configuration of a translucent breadboard, according to aspects of the present disclosure.
Figure 8B:
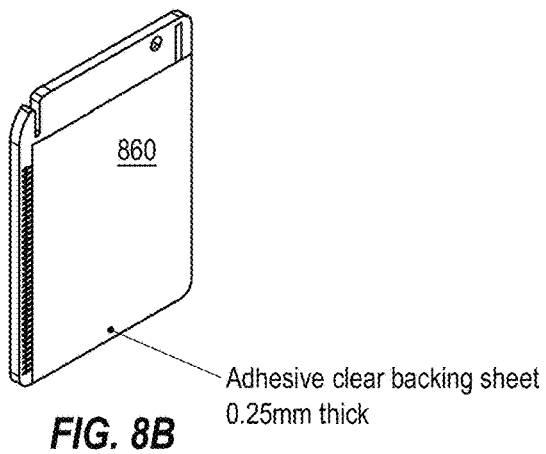
FIG. 8B is a back view of the breadboard of FIG. 8A, according to aspects of the present disclosure.
Figure 8C:
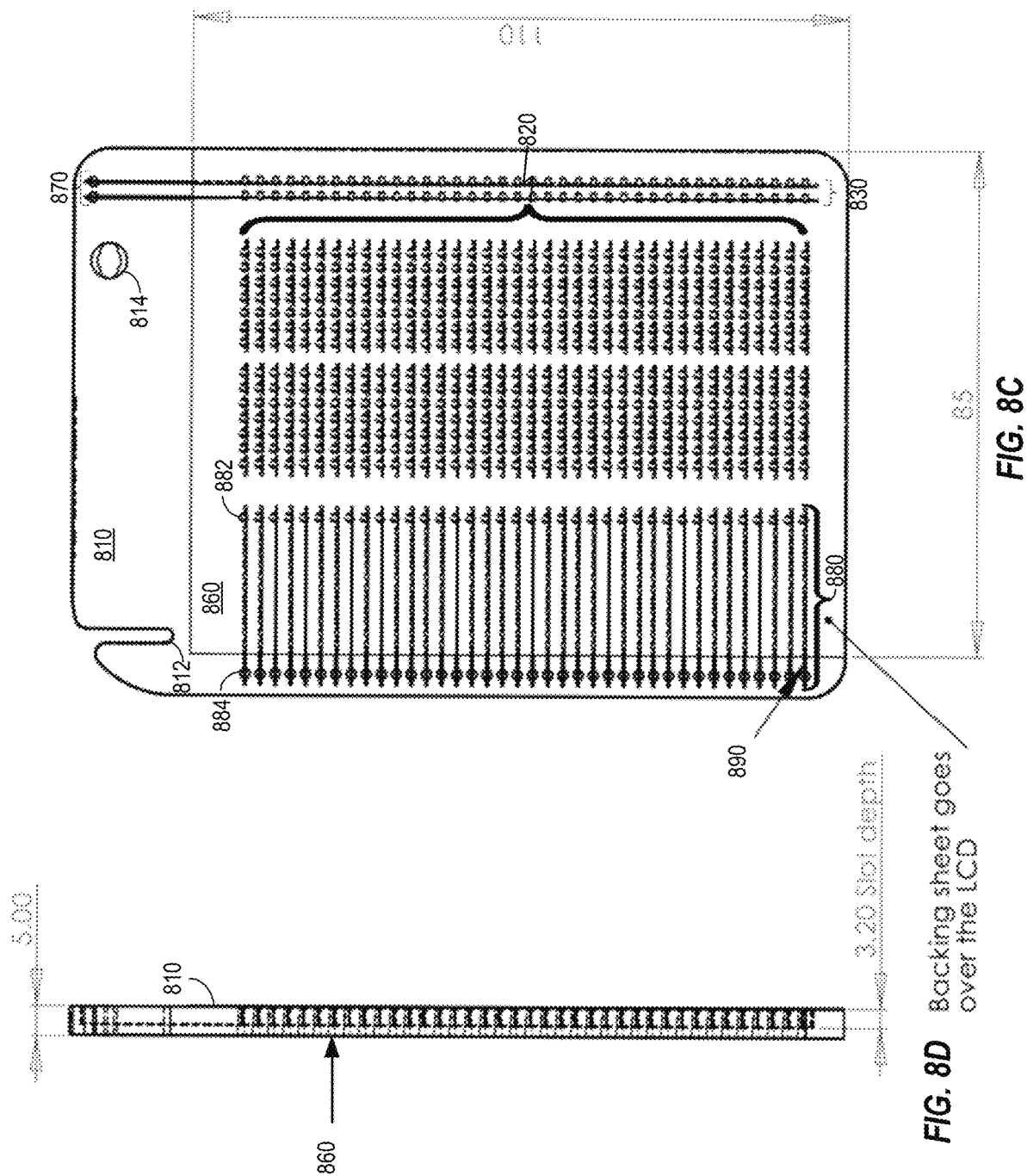
FIG. 8C further illustrates the back view of the breadboard of FIG. 8A, according to aspects of the present disclosure.
Figure 8E:
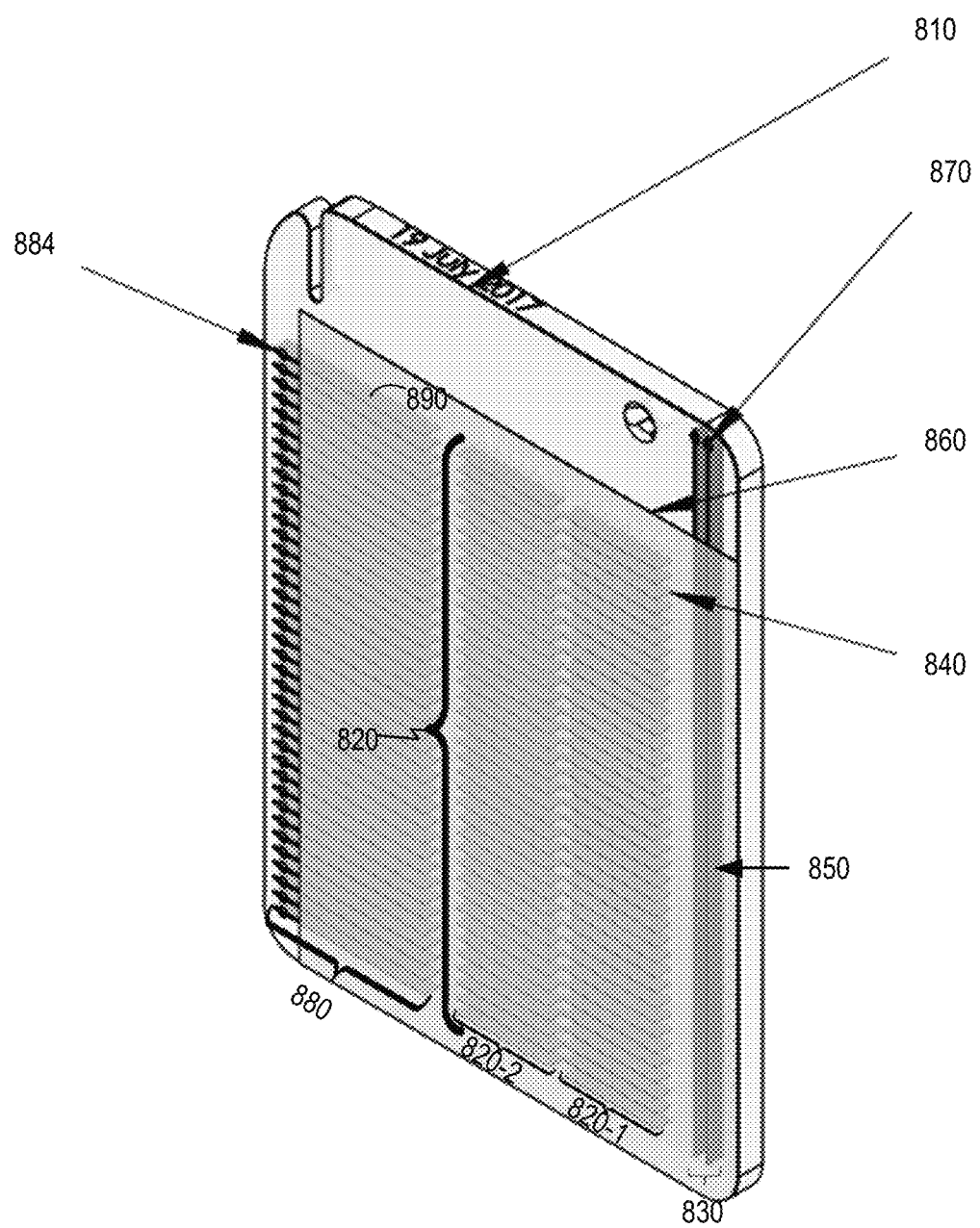
FIG. 8E further illustrates the back view of the breadboard of FIG. 8A, according to aspects of the present disclosure.

FIG. 8A is a top view of a configuration of a translucent breadboard 800, according to aspects of the present disclosure. FIG. 8B is a back view of the translucent breadboard 800 of FIG. 8A, according to aspects of the present disclosure. FIG. 8C further illustrates the back view of the translucent breadboard 800 of FIG. 8A, according to aspects of the present disclosure. FIG. 8D is a long edge view of the translucent breadboard of FIG. 8A, according to aspects of the present disclosure. FIG. 8E further illustrates the back view of the translucent breadboard of FIG. 8A, according to aspects of the present disclosure.

As shown in FIG. 8A, the translucent breadboard 800 also includes a translucent face plate 810 having a first rectangular grid 820-1 and a second rectangular grid 820-2 of first openings 102 (e.g., two columns and 38 rows for placement of electronic components). The first rectangular grid 820-1 and the second rectangular grid 820-2 may be separated by a ravine in a dual in-line package configuration. The first openings 802 are arranged as rows for placement of electronic component pins and wires for forming an electronic circuit. The translucent face plate 810 also includes the columns 830 of second openings 104 for connecting, for example, a power supply (e.g., power and ground rails). In this configuration, the columns 830 are coupled to power/ground female pin openings 870 (e.g., pogo pins) for connecting the columns 830 to a power rail and a ground rail of a computing device (see FIG. 9A).

FIG. 8A illustrates various dimensions of the translucent breadboard 800, according to aspects of the present disclosure. In this configuration, the translucent breadboard 800 is rectangular shaped, having a length of approximately one-hundred thirty millimeters and a width of ninety two millimeters (e.g. 130 millimeters by 90 millimeters). Dimensions of the first rectangular grid 820-1 and the second rectangular grid 820-2, the columns 130, and dimensions of the columns 130 relative to an edge of a display screen (e.g., edge of liquid crystal display (LCD) 816).

The translucent breadboard 800 also includes a cutout portion 812 to aid in aligning the translucent breadboard 800 on a display screen of the computing device, for example, as shown in FIG. 8A. In one configuration, the translucent breadboard 800 includes a lock 814 for securing to a housing of the computing device. An outline of a clear adhesive backing sheet 860 of the translucent breadboard 800 is also shown. FIG. 8B is a back view of the translucent breadboard 800 of FIG. 8A, further illustrating the clear adhesive backing sheet 860, according to aspects of the present disclosure. In this arrangement, the clear adhesive backing sheet 860 includes an adhesive layer for adhering to a display screen of a computing device. In this example, the clear adhesive backing sheet 860 has a thickness of approximately 0.25 millimeters.

In contrast the first two-side female connector 106 and the second two-sided female connector 108 of the translucent breadboard 100 shown in FIGS. 1A-1C, the translucent breadboard 800 also includes female pins 880 (e.g., pogo pins) for connecting to a computing device. The female pins 880 may include a first column of front-side female pin openings 882 and a second column of backside female pin openings 884. The front-side female pin openings 882 may be connected to the first rectangular grid 820-1 and the second rectangular grid 820-2 to enable diagnostic reading of any of the electronic components attached to any of the first openings 802. The backside view of the translucent breadboard 800 of FIG. 8A, including the backside female pin openings 884, is further illustrated in FIG. 8C.

FIG. 8C further illustrates the back view of the translucent breadboard 800 of FIG. 8A, according to aspects of the present disclosure. In this arrangement, each of the backside female pin openings 884 is electrically coupled to one of the front-side female pin openings 882 through one of the pin contacts 890, which are further illustrated in FIG. 8E. The clear adhesive backing sheet 860, in this example, is shown as having a rectangular shape with a length of one-hundred ten millimeters and a width of eighty-five millimeters (e.g., 110 millimeters by 85 millimeters). In addition, as shown in FIG. 8D, a thickness of the translucent breadboard 800 may be five (5) millimeters. A slot depth for inserting orthogonal contacts is shown as 3.2 millimeters, as further illustrated in FIG. 8E.

FIG. 8E further illustrates the back view of the translucent breadboard of FIG. 8C, according to aspects of the present disclosure. In this aspect of the present disclosure, as show in FIG. 8A, the first openings 802 and the second openings 804 of translucent face plate 810 may expose the orthogonal contacts shown in FIG. 8E.

In the arrangement shown in FIG. 8E, the pin contacts 890 coupling the backside female pin openings 884 to the front-side female pin openings 882 are orthogonal to the translucent face plate 810, such that light emanates through the front-side female pin openings 882. Within the translucent face plate 810, there are horizontal slots (see FIG. 8D) formed as rows of the first rectangular grid 820-1 and the second rectangular grid 820-2 of the first openings 802 and vertical slots formed as the columns 830 of the second openings 804. The X-contacts 840 line rows of the first rectangular grid 820-1 and the second rectangular grid 820-2, which are exposed by the first openings 802. Similarly, the Y-contacts 850 line the columns 830 and are exposed by the second openings 104. In this arrangement, pin contacts 890, the X-contacts 840, and the Y-contacts 850 apply pressure upon the abutting terminals of electronic components to secure them within the translucent breadboard 800 by, for example, pressing the terminals 312 against channel walls (e.g., sidewalls 112) of the translucent face plate 110, as shown in FIG. 3A.

Figures 9A, 9B:
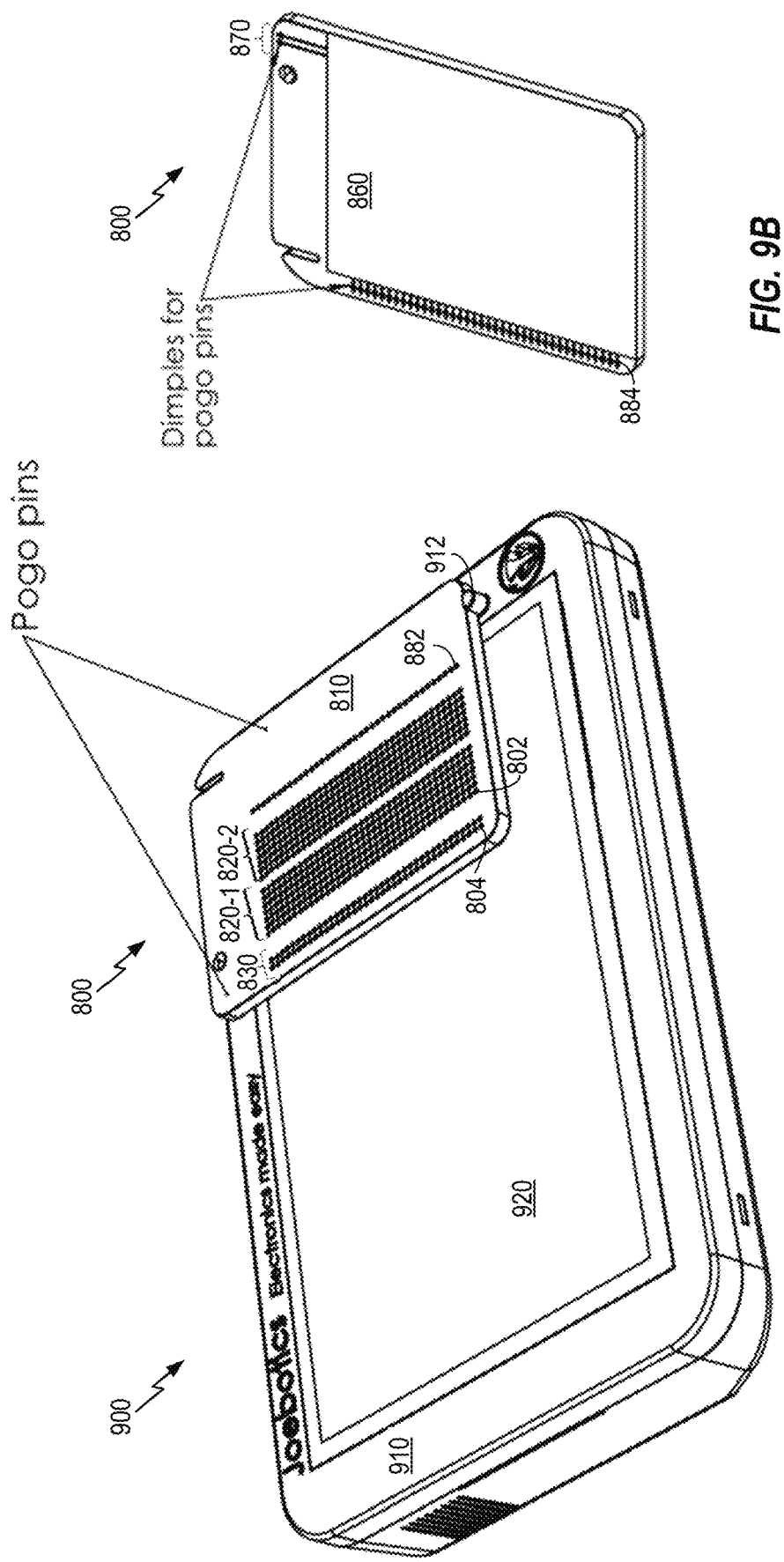

FIGS. 9A-9D are perspective views of the translucent breadboard 800 used with a computing device 900 to form an electronic breadboard system, according to aspects of the present disclosure. FIG. 9A shows the translucent breadboard 800 attached to a housing 910 of the computing device 900 including an alignment pole 912. In this example, instructions may be provided to the user for placing electronic components in the first rectangular grid 820-1 and/or the second rectangular grid 820-2 of the first openings 802 and/or the columns 830 of the second openings 804 of the translucent face plate 810 of the translucent breadboard 800. Light from the display screen may illuminate a row of the first openings 802, the second openings 804, and/or the front-side female pin openings 882, that is visible to the user through the translucent face plate 810 of the translucent breadboard 800 for placing electronic components.

FIG. 9B illustrates a backside of the translucent breadboard 800 further illustrating the backside female pin openings 884 as well as power/ground female pin openings 870 for mating corresponding male pins of a computing device, for example, as shown in FIG. 9C.

FIGS. 9C and 9D show the translucent breadboard 800, prior to attachment to the housing 910 of the computing device 900, according to aspects of the present disclosure. In this example, the housing of the computing device includes the alignment pole 912, a first alignment wall portion 914, and a second alignment wall portion 916. The second alignment wall portion 916 is arranged on the housing to mate with the cutout portion 812 of the translucent breadboard 800. The housing 910 also includes a lock portion 918 corresponding to the lock 814 of the translucent breadboard 800 for securing to the housing 910 of the computing device 900.

In this configuration, the computing device 900 includes male power/ground pins 970 for mating with the power/ground female pin openings 870 of the translucent breadboard 800. The computing device 900 also includes male pins 980 mating with the female pins 880 of the translucent breadboard 800. The male pins 980 and the female pins 880 may be configured as pogo pins for enables the computing device 900 to access electronic components and circuits affixed to the translucent breadboard 800. The male pins 980 may be mapped to general purpose input/output (GPIO) pins of the computing device 900 (e.g., GPIO pins on an Odroid). Diagnostic analysis of the circuits formed on the translucent breadboard 800 may be performed through the GPIO pins of the computing device 900.

Figure 10:
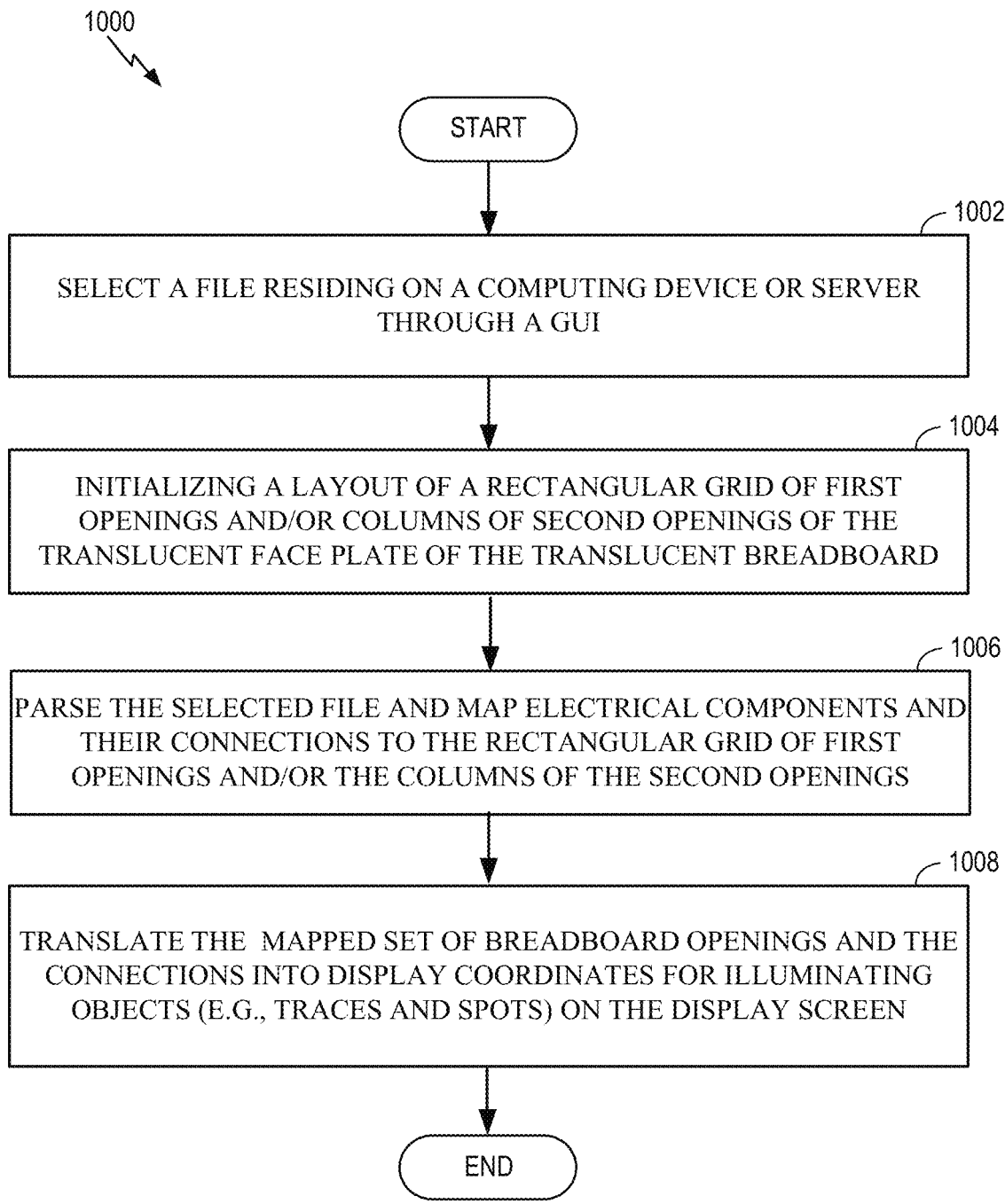
FIG. 10 is a flow chart illustrates a method for breadboard experimentation according to aspects of the present disclosure.

FIG. 10 is a flow chart illustrates a method 1000 for breadboard experimentation according to aspects of the present disclosure. In one configuration, the method 1000 for using of the breadboard has various operations indicated in the flow chart of FIG. 10, noting that some of these operations may be performed out of the order indicated below.

At block 1002, a user selects an electronic file residing on a computing device or server through a GUI. This file may provide a description of an electronic circuit, including the constituent electrical components and their connections that form the circuit in which the user is experimenting. For example, a component listed in the file may be identified by a unique reference number that is specific to the particular circuit defined by the file (e.g., IC4, R5), and by either a commonly recognized name or part number, (e.g. LM555), or by its electrical characteristics (e.g., 2.2 k Ohms ¼ W).

At block 1004, the computing device (executing software) may be configured to represent the opening size and opening spacing of the translucent breadboard (e.g., 0.1 inch or 2.54 mm). For example, as shown in FIGS. 3E, 7, and 8A-8E, dimensions and locations of the rectangular grid 120 of the first openings 102 and the columns 130 of the second openings 104 in the translucent face plate 110 of the translucent breadboard 100 (or 800) are provided to the executing software. This information is used for initializing, registering, and/or alignment of the translucent breadboard 100 on the display screen 720, as driven by a GUI. For example the position of the rectangular grid 120 of the first openings 102 and the columns 130 of the second openings 104 is translated into pixels or display coordinates of the display screen by the executing software. This may include sending a circuit wiring connection layout composed of a visual representation of circuit elements.

Referring again to FIG. 10, at block 1006, the selected file is parsed by the computing device, and the electrical components and their connections (or the circuit/network nodes, listed in the file) are then mapped to connections between individual ones of the set of breadboard openings. For example, as shown in FIGS. 3E and 7, the electrical components and their connections (e.g., made either through the terminals of electronic components or through electrical traces defined by the circuit) are mapped to the rectangular grid 120 of the first openings 102 and/or the columns 130 of the second openings 104 in the translucent face plate 110.

At block 1008, the mapped set of breadboard openings and the connections between the mapped breadboard openings are translated by the computing device in view of the alignment of the breadboard. The translation of the openings is performed into display coordinates for illuminating objects (e.g., traces and spots) on the display screen. For example, as shown in FIG. 7, illuminating the highlighted row 142 results in the user easily insert the correct electrical component terminals or wire segments into the correct openings of the translucent breadboard 100 that are aligned with the illuminated objects. In this example, the computing device displays the location of the placement of a circuit element through the translucent face plate 110 of the translucent breadboard 100 that is distal to the user. The location of placement is visible to the user with the naked eye without magnification through translucent face plate 110 of the translucent breadboard 100 that is proximal to the user. To do so, an alignment process may be needed as described above.

These processes described are exemplary, however, and other processes may also be used to enable circuit experimentation on the translucent breadboard 100. For example, this process may include sending a circuit wiring connection layout comprising a visual representation of circuit elements to the display screen by the computing device. This process also includes receiving a selection of a circuit element from the user. The process further includes sending to the display screen a signal to illuminate a portion of the display screen beneath a translucent breadboard indicating where a user should place the selected circuit element on the translucent breadboard.

According to a further aspect of the present disclosure, a translucent breadboard used with a computing device to form an electronic breadboard system is described. The electronic breadboard system may include means illuminating a row opening and/or a column opening of the translucent breadboard to direct placement of electrical components of a computer model in response to user interaction with the electronic circuit model. The means for illuminating may, for example, include a graphic controller of the computing device shown in FIGS. 9A and 9B. In another aspect, the aforementioned means may be any layer, module, or any apparatus configured to perform the functions recited by the aforementioned means.

Figure 11:
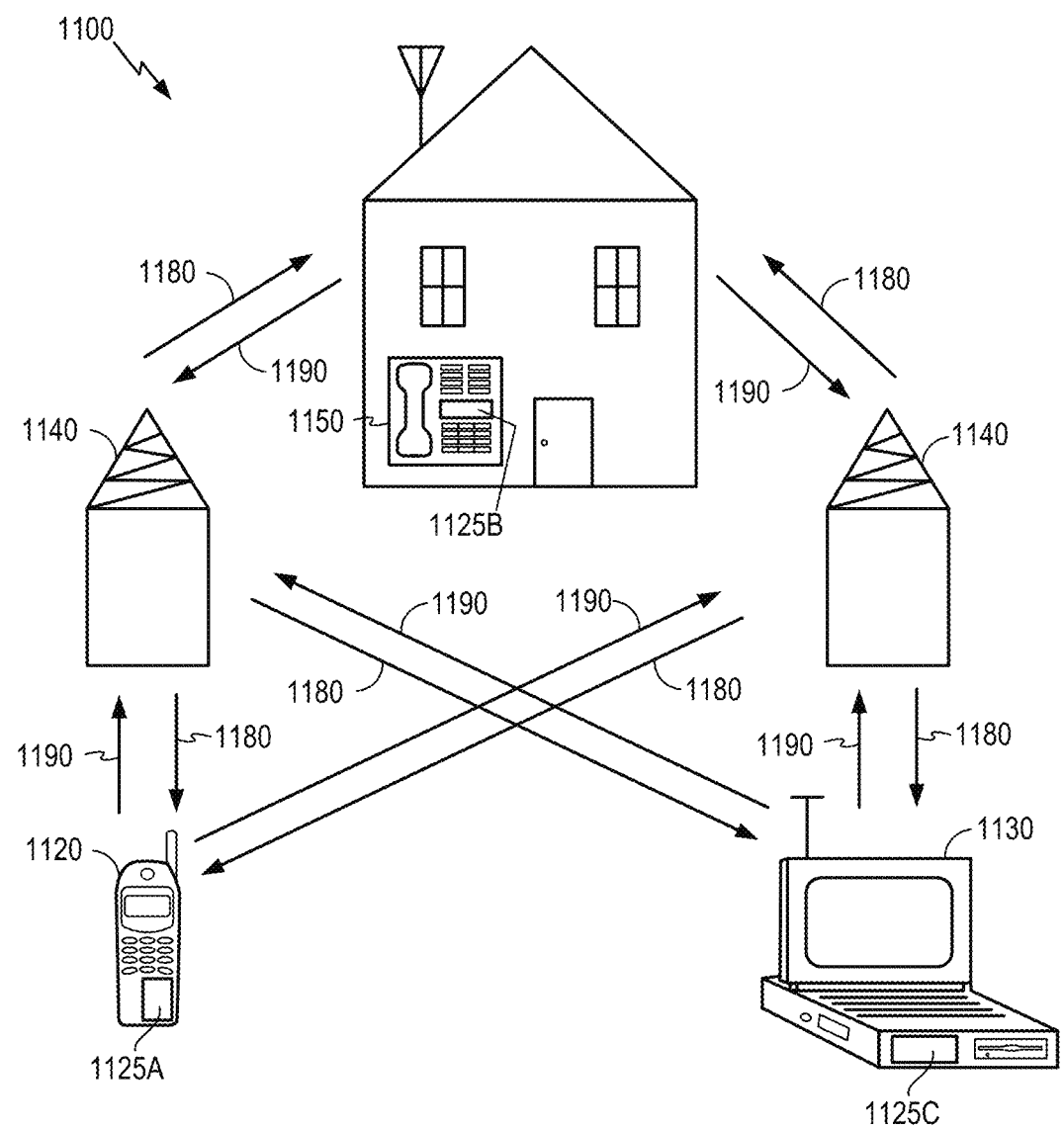
FIG. 11 is a block diagram showing an exemplary wireless communication system in which an aspect of the disclosure may be advantageously employed.

FIG. 11 is a block diagram showing an exemplary wireless communication system 1100 in which an aspect of the disclosure may be advantageously employed. For purposes of illustration, FIG. 11 shows three remote units 1120, 1130, and 1150 and two base stations 1140. It will be recognized that wireless communication systems may have many more remote units and base stations. Remote units 1120, 1130, and 1150 include IC devices 1125A, 1125C, and 1125B that include the disclosed IC device. It will be recognized that other devices may also include the disclosed IC device, such as the base stations, switching devices, and network equipment. FIG. 11 shows forward link signals 1180 from the base station 1140 to the remote units 1120, 1130, and 1150 and reverse link signals 1190 from the remote units 1120, 1130, and 1150 to base station 1140.

In FIG. 11, remote unit 1120 is shown as a mobile telephone, remote unit 1130 is shown as a portable computer, and remote unit 1150 is shown as a fixed location remote unit in a wireless local loop system. For example, the remote units may be a mobile phone, a hand-held personal communication systems (PCS) unit, a portable data unit such as a personal data assistant, a GPS enabled devices, a navigation device, a set top box, a music player, a video player, an entertainment unit, a fixed location data unit such as meter reading equipment, or other devices that store or retrieve data or computer instructions, or combinations thereof. Although FIG. 11 illustrates remote units according to the aspects of the disclosure, the disclosure is not limited to these exemplary illustrated units. Aspects of the disclosure may be suitably employed in many devices, which include the disclosed IC device.

For a firmware and/or software implementation, the methodologies may be implemented with modules (e.g., procedures, functions, and so on) that perform the functions described herein. Machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on a non-transitory computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The steps of a method or algorithm described in connection with the disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), and Blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. A method for using a translucent breadboard, comprising:
    accessing an electronic file that provides a description of a plurality of electrical components and a plurality of component connections to form a circuit in which a user is experimenting;
    obtaining information regarding a size and spacings of openings within the translucent breadboard for initializing, registering and/or aligning the translucent breadboard on a display screen;
    mapping the plurality of electrical components and the plurality of component connections as defined in the electronic file, to a set of breadboard openings arranged to expose contacts in individual ones of the set of breadboard openings; and
    translating the set of breadboard openings and the plurality of component connections to display coordinates for illuminating traces and spots on the display screen, in view of the aligning.

2. The method of claim 1, further comprising:
    displaying a location for placing a circuit element through a bottom face of the translucent breadboard being distal to the user to illuminate a row/column opening through the translucent breadboard being proximal to the user.

3. The method of claim 1, further comprising: illuminating locations of the translucent breadboard for placing a circuit element in electrical contact with ones of the contacts by illuminated openings visible to the user through the translucent breadboard.

4. The method of claim 1, further comprising receiving, from the translucent breadboard, a circuit characteristic at a computing device, and obtaining a measurement associated with the circuit characteristic.

5. The method of claim 1, further comprising:
    illuminating alignment points for placing the translucent breadboard on the display screen; and
    detecting a response from the user when the user completes alignment of the translucent breadboard and computing device.

6. A non-transitory computer-readable medium comprising instructions, which when executed perform a method, the method comprising:
    obtaining information regarding a size and spacings for openings within the translucent breadboard for aligning the translucent breadboard on a display screen;
    mapping a plurality of electrical components and a plurality of component connections as defined in an electronic file for a circuit in which a user is experimenting, to a set of breadboard openings arranged to expose contacts in individual ones of the set of breadboard openings;
    translating the set of breadboard openings and the plurality of component connections to display coordinates for illuminating traces and spots on the display screen, in view of the aligning;
    sending, to a display screen, a circuit wiring connection layout comprising a visual representation of circuit elements of the circuit in which the user is experimenting;
    receiving a selection of a circuit element from the user; and
    sending to a display screen a signal to illuminate a portion of the display screen beneath the translucent breadboard indicating where the user should place a selected circuit element on the translucent breadboard.

7. The non-transitory computer-readable medium of claim 6, wherein the method further comprises:
    displaying a location for placing a circuit element through a bottom face of the translucent breadboard being distal to the user to illuminate a row/column opening through the translucent breadboard being proximal to the user.

8. The non-transitory computer-readable medium of claim 6, wherein the method further comprises illuminating locations of the translucent breadboard for placing a circuit element in electrical contact with ones of the contacts by illuminated openings visible to the user through the translucent breadboard.

9. The non-transitory computer-readable medium of claim 6, wherein the method further comprises receiving, from the translucent breadboard, a circuit characteristic at a computing device, and obtaining a measurement associated with the circuit characteristic.

10. The non-transitory computer-readable medium of claim 6, wherein the method further comprises:
   illuminating alignment points for placing the translucent breadboard on the display screen; and
   detecting a response from the user when the user completes alignment of the translucent breadboard and computing device.

11. The non-transitory computer-readable medium of claim 6, wherein the method further comprises:
   obtaining information regarding the size and the spacings of the openings within the translucent breadboard for initializing and/or registering the translucent breadboard on a display screen.

12. A non-transitory computer-readable medium comprising instructions, which when executed perform a method, the method comprising:
   accessing an electronic file that provides a description of a plurality of electrical components and a plurality of component connections to form a circuit in which a user is experimenting;
   obtaining information regarding a size and spacings of openings within the translucent breadboard for initializing, registering and/or aligning the translucent breadboard on a display screen;
   mapping the plurality of electrical components and the plurality of component connections as defined in the electronic file, to a set of breadboard openings arranged to expose contacts in individual ones of the set of breadboard openings; and
   translating the set of breadboard openings and the plurality of component connections to display coordinates for illuminating traces and spots on the display screen, in view of the aligning.

13. The non-transitory computer-readable medium of claim 12, wherein the method further comprises:
   displaying a location for placing a circuit element through a bottom face of the translucent breadboard being distal to the user to illuminate a row/column opening through the translucent breadboard being proximal to the user.

14. The non-transitory computer-readable medium of claim 12, wherein the method further comprises: illuminating locations of the translucent breadboard for placing a circuit element in electrical contact with ones of the contacts by illuminated openings visible to the user through the translucent breadboard.

15. The non-transitory computer-readable medium of claim 12, wherein the method further comprises receiving, from the translucent breadboard, a circuit characteristic at a computing device, and obtaining a measurement associated with the circuit characteristic.

16. The non-transitory computer-readable medium of claim 12, wherein the method further comprises:
   illuminating alignment points for placing the translucent breadboard on the display screen; and
   detecting a response from the user when the user completes alignment of the translucent breadboard and computing device.

* * * * *